US008618920B2

(12) United States Patent
Tanaka

(10) Patent No.: US 8,618,920 B2
(45) Date of Patent: Dec. 31, 2013

(54) MOBILE DEVICE FOR PROVIDING ANNOUNCEMENT INFORMATION

(75) Inventor: Masahide Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 440 days.

(21) Appl. No.: 12/995,212

(22) PCT Filed: May 28, 2009

(86) PCT No.: PCT/JP2009/059796
§ 371 (c)(1),
(2), (4) Date: Nov. 30, 2010

(87) PCT Pub. No.: WO2009/145267
PCT Pub. Date: Dec. 3, 2009

(65) Prior Publication Data
US 2011/0095876 A1  Apr. 28, 2011

(30) Foreign Application Priority Data

May 31, 2008 (JP) ................... 2008-143984
Jun. 6, 2008 (JP) ................... 2008-149940
Jun. 12, 2008 (JP) ................... 2008-154086
Jun. 12, 2008 (JP) ................... 2008-154447

(51) Int. Cl.
G08B 3/00 (2006.01)
(52) U.S. Cl.
USPC ............ 340/384.1; 340/539.11; 340/4.1; 340/407.1; 455/567; 701/300; 701/465
(58) Field of Classification Search
USPC ........ 340/407.1, 457, 539.1, 539.11, 539.13, 340/286.11, 384.1, 10.1, 4.1; 455/567; 701/300, 465
See application file for complete search history.

(56) References Cited

U.S. PATENT DOCUMENTS

| | | | | |
|---|---|---|---|---|
| 5,647,011 A * | 7/1997 | Garvis | ......................... | 381/123 |
| 6,374,176 B1 * | 4/2002 | Schmier et al. | ............... | 701/465 |
| 6,407,673 B1 * | 6/2002 | Lane | ............................. | 340/901 |
| 6,700,506 B1 * | 3/2004 | Winkler et al. | ............... | 340/994 |
| 6,714,142 B2 * | 3/2004 | Porter et al. | ................... | 340/988 |
| 7,312,749 B2 * | 12/2007 | Yeh | ......................... | 342/357.52 |
| 7,765,270 B2 * | 7/2010 | Umezawa-san et al. | ...... | 709/216 |
| 7,869,768 B1 * | 1/2011 | Vishlitzky | ................... | 455/67.13 |
| 8,068,025 B2 * | 11/2011 | Devenyi et al. | ............... | 340/540 |
| 8,307,029 B2 * | 11/2012 | Davis et al. | .................... | 709/203 |
| 2004/0179694 A1 * | 9/2004 | Alley | .............................. | 381/55 |
| 2004/0203353 A1 * | 10/2004 | Connor | ......................... | 455/41.1 |
| 2005/0140544 A1 * | 6/2005 | Hamel et al. | ............. | 342/357.08 |
| 2005/0239436 A1 * | 10/2005 | Bell et al. | .................... | 455/404.2 |
| 2006/0009905 A1 * | 1/2006 | Soderberg et al. | ............ | 701/200 |

(Continued)

FOREIGN PATENT DOCUMENTS

GB  2411755 A  *  9/2005
JP  2-206927    8/1990

(Continued)

Primary Examiner — Eric M Blount
(74) Attorney, Agent, or Firm — Fish & Richardson P.C.

(57) ABSTRACT

Provided is a mobile device including: an audio output unit; an audio source unit which provides music information to the audio output unit; an adjustment unit which adjusts the audio volume of the audio output unit; an announcement information generation unit which provides announcement information to the audio output unit; and a control unit which forcibly selects a predetermined audio volume regardless of the adjustment made by the adjustment unit when announcing information by the announcement information generation unit from the audio output unit.

19 Claims, 7 Drawing Sheets

(56) References Cited

U.S. PATENT DOCUMENTS

| | | |
|---|---|---|
| 2006/0217829 A1* | 9/2006 | Umezawa et al. ............ 700/94 |
| 2007/0208502 A1 | 9/2007 | Sakamoto et al. |
| 2007/0293276 A1* | 12/2007 | Ushijima ................... 455/567 |
| 2008/0102786 A1* | 5/2008 | Griffin .................... 455/404.2 |
| 2009/0076816 A1* | 3/2009 | Bradford et al. ............ 704/235 |
| 2009/0316532 A1 | 12/2009 | Hasegawa |
| 2010/0066499 A1 | 3/2010 | Ishihara |

FOREIGN PATENT DOCUMENTS

| | | | |
|---|---|---|---|
| JP | 2002-204467 | | 7/2002 |
| JP | 2002-230461 | | 8/2002 |
| JP | 2005086718 A | * | 3/2005 |
| JP | 2005-321841 | | 11/2005 |
| JP | 2006-277203 | | 10/2006 |
| JP | 2006277203 A | * | 10/2006 |
| JP | 2007-120953 | | 5/2007 |
| JP | 2007120953 A | * | 5/2007 |
| JP | 2007-265276 | | 10/2007 |
| JP | 2008-22138 | | 1/2008 |
| JP | 2008-035144 | | 2/2008 |
| WO | 2008/053707 | | 5/2008 |

\* cited by examiner

MOBILE DEVICE FOR PROVIDING ANNOUNCEMENT INFORMATION

TECHNICAL FIELD

The present invention relates to a mobile device such as a mobile phone or a mobile information terminal.

BACKGROUND ART

A mobile device has various pieces of information and functions, and various proposals have been made concerning utilization of such information and functions.

PRIOR ART DOCUMENTS

Patent Documents

Patent document 1: JP-A-2002-204467
Patent document 2: JP-A-2007-265276
Patent document 3: JP-A-2008-35144

DISCLOSURE OF THE INVENTION

Problem to be Solved by the Invention

However, there are still many problems to be studied for utilizing information and functions of mobile devices more effectively.

An object of the present invention is, in view of the above discussion, to provide a mobile device that can utilize functions effectively for information announcement to the owner of the mobile device.

Means for Solving the Problem

In order to achieve the above-mentioned object, a mobile device according to the present invention includes an audio output unit, an audio source unit which provides music information to the audio output unit, an adjustment unit which adjusts audio volume of the audio output unit, an announcement information generation unit which provides announcement information to the audio output unit, and a control unit which select a predetermined audio volume forcibly regardless of adjustment by the adjustment unit when the information by the announcement information generation unit is announced from the audio output unit (first structure).

Note that in the mobile device having the first structure, it is preferable that the audio output unit includes an earphone (second structure).

In addition, in the mobile device having the first structure, it is preferable that the control unit disables sound output from the audio output unit for a predetermined time before announcing information by the announcement information generation unit from the audio output unit (third structure).

In addition, it is preferable that the mobile device according to the present invention includes a vibration generation unit, a selection unit which selects whether or not to generate vibration by the vibration generation unit, an announcement information generation unit, and a control unit which controls the vibration generation unit to generate vibration forcibly regardless of the selection by the selection unit when announcing information by the announcement information generation unit (fourth structure).

Note that it is preferable that the mobile device having the first or fourth structure includes an acceleration detection unit, a storage unit which stores an acceleration variation pattern that is unique to a predetermined movement of the entire mobile device, a comparison unit which compares acceleration variation detected by the acceleration detection unit with the acceleration variation pattern stored in the storage unit, and a decision unit which decides whether or not the entire mobile device had a predetermined movement on the basis of a comparison result by the comparison unit, in which the announcement information generation unit generates announcement information on the basis of the decision by the decision unit (fifth structure).

In addition, the mobile device according to the present invention includes an acceleration detection unit, a storage unit which stores an acceleration variation pattern that is unique to a predetermined movement of the entire mobile device, a comparison unit which compares the acceleration variation detected by the acceleration detection unit with the acceleration variation pattern stored in the storage unit, a decision unit which decides whether or not the entire mobile device had a predetermined movement on the basis of a comparison result of the comparison unit, and an announcement information generation unit which generates announcement information on the basis of the decision of the decision unit (sixth structure).

Further, it is preferable that the mobile device having the sixth structure includes a position detection unit which detects a position of the mobile device itself, and the decision unit decides whether or not the entire mobile device had a predetermined movement on the basis of the acceleration detection unit and the position detection unit (seventh structure).

In addition, it is preferable that the mobile device having the sixth structure includes an information obtaining unit which obtains information about location of the mobile device itself, and a decision unit which decides the location of the entire mobile device on the basis of the acceleration detection unit and the information obtaining unit (eighth structure).

In addition, it is preferable that the mobile device having the eighth structure includes a transmission unit which transmits a decision result of the decision unit (ninth structure).

In addition, in the mobile device having the sixth structure, it is preferable that the storage unit stores an acceleration variation pattern unique to departure of the vehicle on which the owner of the mobile device boards, and the decision unit decides the departure of the vehicle (tenth structure).

In addition, in the mobile device having the sixth structure, it is preferable that the storage unit stores an acceleration variation pattern unique to stopping of the vehicle on which the owner of the mobile device boards, and the decision unit decides the stopping of the vehicle in advance (eleventh structure).

In addition, it is preferable that the mobile device having the sixth structure includes a control unit which estimates in advance an arrival at an expected getting-off place of the vehicle on which the owner of the mobile device boards on the basis of the decision unit (twelfth structure).

In addition, it is preferable in the mobile device having the twelfth structure that the control unit includes a counter which counts the number of times of a predetermined movement detected by the decision unit, so as to estimate in advance an arrival of the vehicle at the expected getting-off place on the basis of a count value of the counter (thirteenth structure).

In addition, it is preferable that the mobile device having the sixth structure includes a current time information obtaining unit, and a control unit which estimates a next movement of the entire mobile device on the basis of a predetermined movement detected by the decision unit and current time obtained by the current time information obtaining unit (fourteenth structure).

In addition, it is preferable that the mobile device having the sixth structure includes a keeping unit of position information of the expected getting-off place of the vehicle, a position detection unit which detects a position of the mobile device itself, and an approach detection unit which detects an approach of the vehicle at the expected getting-off place from the position information of the keeping unit and a position detected by the position detection unit, so as to estimate in advance an arrival of the vehicle at an expected getting-off place on the basis of the approach detection by the approach detection unit and a predetermined movement decided by the decision unit (fifteenth structure).

In addition, it is preferable that the mobile device having the sixth structure includes a position detection unit which detects a position of the mobile device itself, and a control unit which estimates a next movement of the entire mobile device on the basis of a predetermined movement decided by the decision unit and a position detected by the position detection unit (sixteenth structure).

In addition, it is preferable that the mobile device having the sixth structure includes a keeping unit which keeps information about a plan of movement of the entire mobile device, and a control unit which estimates a next movement of the entire mobile device on the basis of a predetermined movement decided by the decision unit and information kept by the keeping unit (seventeenth structure).

In addition, it is preferable in the mobile device having the sixth structure that the decision unit estimates that the vehicle on which the owner of the mobile device boards is decelerating so as to stop at a predetermined station (eighteenth structure).

In addition, it is preferable that the mobile device having the sixth structure includes a ticket information providing unit, an event information providing unit, and a control unit which estimates a place to get off the vehicle on the basis of information from the ticket information providing unit and the event information providing unit, in which the announcement unit generates announcement information about a relationship between the mobile device and the place to get off on the basis of estimation by the control unit and decision by the decision unit (nineteenth structure).

In addition, it is preferable in the mobile device having the nineteenth structure that the information provided from the event information providing unit relates to an actually boarding vehicle, in which the control unit removes a place to get on or off where the vehicle does not stop from the estimated candidates on the basis of the information from the event information providing unit (twentieth structure).

Effects of the Invention

According to the mobile device of the present invention, its function can be utilized effectively for information announcement to the owner of the mobile device.

BEST MODE FOR CARRYING OUT THE INVENTION

Figure 1:
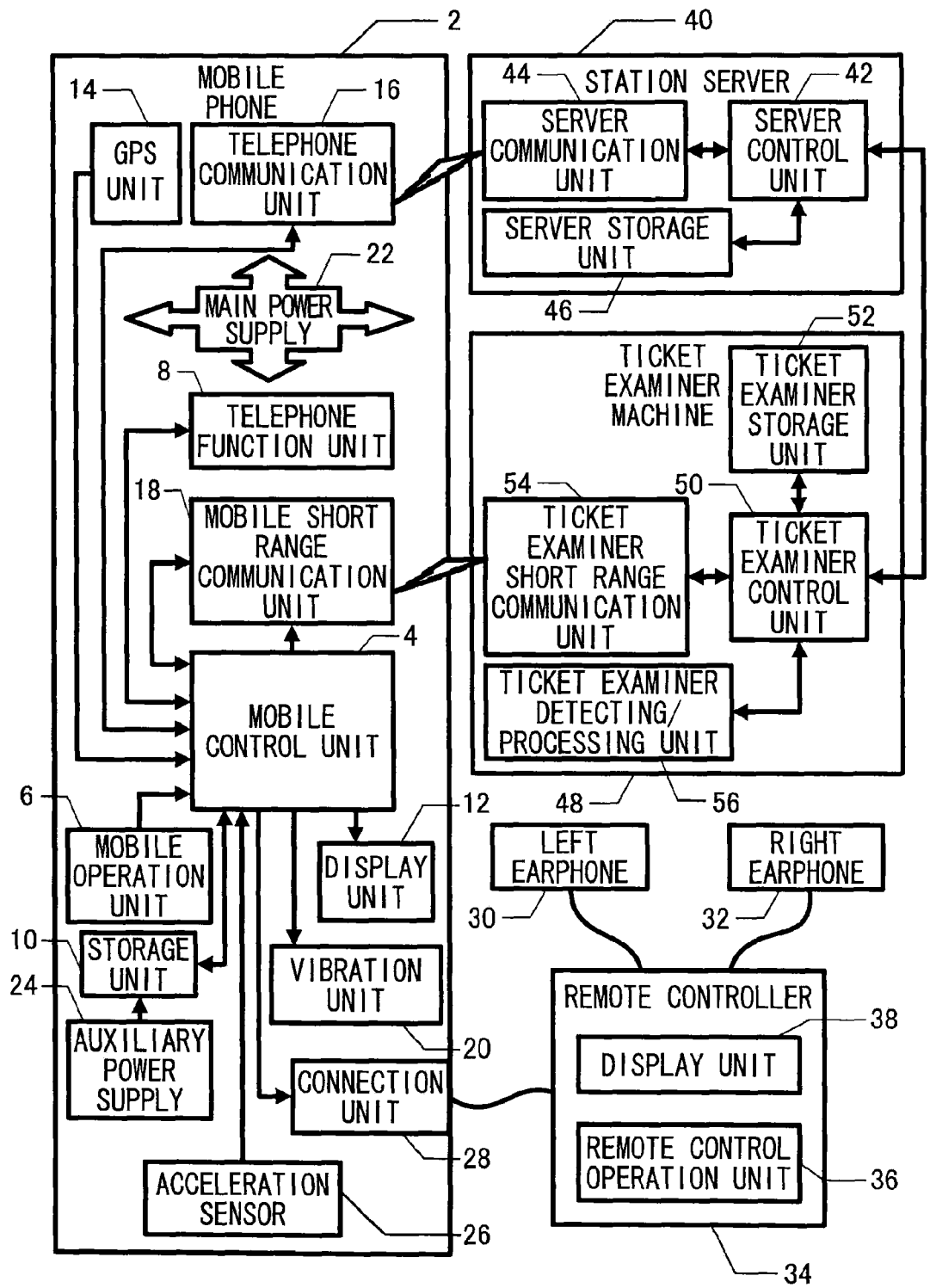
FIG. 1 is a block diagram illustrating an example of a mobile device system according to an embodiment of the present invention.

FIG. 1 is a block diagram illustrating an example of a mobile device system according to an embodiment of the present invention. The example forms a transport using system including a mobile phone 2, in which information about use of a transport facility is stored in the mobile phone 2, so that convenience in use of the transport facility is improved by communication between the mobile phone 2 and a transport facility management system. Further, acceleration and deceleration information accompanying service of the transport facility detected by an acceleration sensor built in the mobile phone 2 is combined with the above-mentioned stored information, so that the convenience in use of the transport facility is further improved.

The mobile phone 2 includes a mobile control unit 4 constituted of a computer which controls the entire mobile phone and controls a telephone function unit 8 and the like in accordance with an operation by a mobile operation unit 6. Functions of the mobile control unit 4 are performed by software stored in a storage unit 10. The storage unit 10 stores information about use of a transport facility such as a route chart, a timetable, a commuter ticket, a ticket and the like as described later, and stores temporarily various data necessary for controlling the entire mobile phone 2. The mobile control unit 4 further controls a display unit 12, so as to perform a GUI display in association with an operation of the mobile operation unit 6 and display a control result.

A GPS unit 14 obtains latitude, longitude, and altitude information as absolute position information of the mobile phone 2 on the basis of a GPS system from satellites or closest broadcasting stations, and sends the information to the mobile control unit 4. The absolute position information is displayed together with a map on the display unit 12 and is provided as navigation information by control of the mobile control unit 4.

The mobile phone 2 can perform wireless communication including ordinary telephone conversation via a telephone line by the telephone function unit 8 and a telephone communication unit 16. The telephone communication unit 16 performs communication for telephone conversation with another mobile phone and communication via the Internet with a station server that will be described later so as to download information about use of a transport facility. In addition, the mobile phone 2 is equipped with a mobile short range communication unit 18 which uses any one of a wireless LAN, feeble wireless communication, and neighborhood field communication, or a combination of them, so that the mobile phone 2 can perform wireless communication with external equipment existing within the short range communication area. The communication by the mobile short range communication unit 18 is based on a specification without legal restriction and with free charge unlike a telephone line or the like, though its communication range is restricted.

The mobile short range communication unit 18 can communicate with a ticket examiner that will be described later, and can transmit the absolute position information obtained by the GPS unit 14 to a GPS unit of other equipment and receive absolute position information that is obtained by the GPS unit of the other equipment. Thus, the display unit 12 can display not only its position but also a position of the other equipment on the same map, so that relative positional relationship between them can be checked on the map. Details thereof is described in Japanese patent application No. 2007-28393 and the like filed by the same applicant. In addition, the mobile phone 2 includes an vibration unit 20, which vibrates the mobile phone 2 so as to notify about incoming call or the like, and notifies the user of being close to an getting-off station on the basis of deceleration detection or the like by an acceleration sensor 26 so as to alarm the user not to ride past as described later.

The entire mobile phone 2 is supplied with electric power by a rechargeable main power supply 22, and the storage unit 10 is further backed up by an auxiliary power supply 24 constituted of lithium battery or the like. Thus, it is possible to prevent information stored in the storage unit 10 from volatizing when the main power supply 22 has discharged or is exchanged.

The mobile phone 2 further includes the acceleration sensor 26, which detects shaking action of the mobile phone 2 by the user so as to constitute an input interface, and detects acceleration or deceleration of the transport facility that the owner of the mobile phone 2 is using so as to provide information indicating approach to an getting-off station.

The mobile phone 2 also includes a connection unit 28 for an external accessory, and an earphone set can be connected to the connection unit 28. The earphone set includes an earphone for left ear 30, an earphone for right ear 32, and a remote controller 34. The remote controller 34 includes a remote control operation unit 36 for handy operation, and a display unit 38. The earphones 30 and 32 reproduce sound information of music contents or game contents stored in the storage unit 10 of the mobile phone 2, and announce to notify an approach to an getting-off station on the basis of deceleration detection or the like by the acceleration sensor 26 so as to alarm the user not to ride past as described later. This alarm may be combined with the alarm by the vibration unit 20.

A station server 40 includes a server control unit 42 constituted of a computer which controls the entire station, and controls a server communication unit 44 to send information about use of a transport facility such as route chart, timetable, commuter ticket to the telephone communication unit 16 of the mobile phone 2. The communication charge is paid by the station server 40 side. The function of the server control unit 42 is performed by software stored in a server storage unit 46. The server storage unit 46 also stores temporarily various data necessary for communication control or the like performed by the server communication unit 44.

The information about use of a transport facility includes ticket information or the like that is necessary every time of use, which is directly sent to the mobile short range communication unit 18 from a ticket issuing place or the like of the station facility without communication charge. Note that as to reserved-seat ticket information or the like that is used each time but can be booked in advance, it is possible to send the information from the server communication unit 44 to the telephone communication unit 16 of the mobile phone 2 with communication charge paid by the station server 40 side similarly to other information.

A ticket examiner machine 48 includes a ticket examiner control unit 50 constituted of a computer which controls the entire ticket examiner machine, and performs control by software stored in a ticket examiner storage unit 52. The ticket examiner control unit 50 is also connected to the server control unit 42 via an intra-station LAN. The ticket examiner storage unit 52 also stores temporarily various data necessary for control of the ticket examiner machine 48. The ticket examiner machine 48 also includes a ticket examiner short range communication unit 54, which communicates with the mobile short range communication unit 18 of the mobile phone 2 carried by the user who passes through the ticket examiner. A result of the communication is processed by a ticket examiner detecting/processing unit 56, so as to detect whether or not the person passing through the ticket examiner is appropriate, and process information necessary for passing.

Note that FIG. 1 illustrates as if the mobile phone 2 and the station server 40 perform communication directly with each other, but as known well, the mobile phone 2 uses a communication network infrastructure for communication, and actually, the telephone communication unit 16 and the server communication unit 44 communicate with each other via a base station (not shown). On the other hand, the mobile phone 2 and the ticket examiner machine 48 communicate directly with each other using the mobile short range communication unit 18 and the ticket examiner short range communication unit 54 as illustrated in the diagram.

Figure 2:
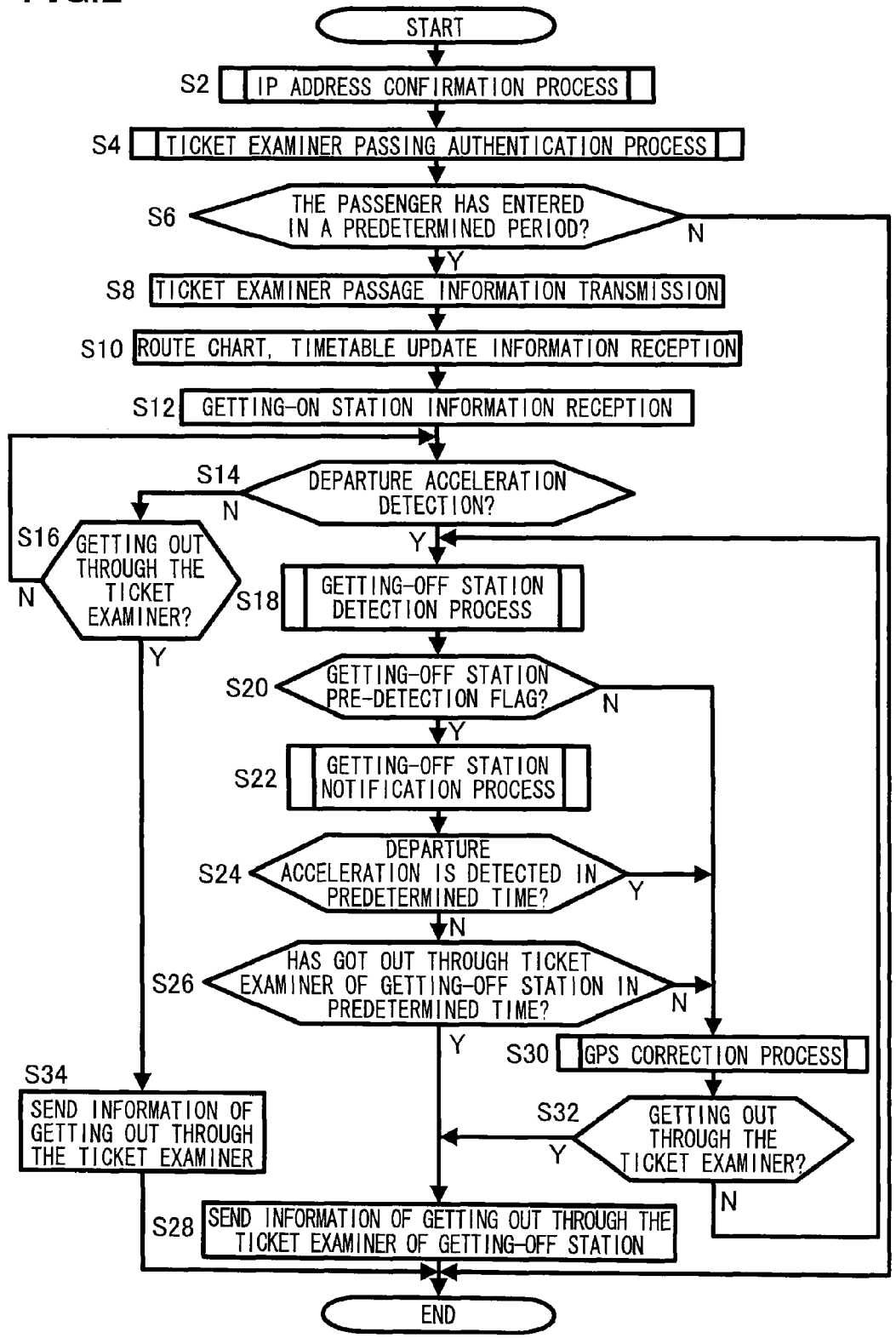
FIG. 2 is a basic flowchart of a mobile control unit according to a first example illustrated in FIG. 1.

FIG. 2 is a basic flowchart of transport facility using function of the mobile control unit 4 according to a first example illustrated in FIG. 1, which starts by detection of an approach to the ticket examiner machine 48 using a short range communication radio wave. When the process flow starts, first in Step S2, a process of checking an IP address of the mobile phone 2 is performed by communication with the ticket examiner machine 48, so as to detect an approach of the owner of the mobile phone 2 to the ticket examiner. Next, in Step S4, a process of authentication whether or not the owner is qualified to pass through the ticket examiner is performed on the basis of commuter ticket information or ticket information stored in the storage unit 10 by communication with the ticket examiner machine 48.

Next, in Step S6, it is checked whether or not the owner of the mobile phone 2 has passed the ticket examiner machine 48 to enter in predetermined time after the authentication by communication between the mobile phone 2 and the ticket examiner machine 48. Note that if passing through the ticket examiner cannot be authenticated in Step S4, a gate of the ticket examiner machine 48 is closed so that the owner of the mobile phone 2 cannot enter through the ticket examiner as a matter of course. When the entrance through the ticket examiner is detected in Step S6, the process goes to Step S8 in which the owner of the mobile phone 2 sends information indicating that the owner has passed through the ticket examiner to the ticket examiner machine 48. Note that the ticket examiner passage information that is sent is transmitted together with the IP address checked in Step S2 from the ticket examiner control unit 50 to the server control unit 42 of the station server 40. The station server 40 transmits the name of the owner of the mobile phone 2, the station name, and ticket examiner passage time from the server communication unit 44 to a destination that is enrolled in advance responding to the received IP address by e-mail via the Internet. The destination is, for example, home of the owner of the mobile phone 4. Thus, it is possible to check a movement of the owner of the mobile phone 2 at home so as to watch a child or an old person.

Next, in Step S10, update information of the route chart, the timetable and the like is received from the ticket examiner machine 48. Further in Step S12, getting-on station information such as a getting-on station name is received from the ticket examiner machine 48, and the process goes to Step S14. In Step S14, it is checked whether or not the acceleration sensor 26 has detected acceleration that is unique to departure of a train. If it has not detected, the process goes to Step S16, in which it is checked whether or not there is an exceptional state where the owner did not take the train but got out through the ticket examiner to make sure. If the owner did not get out, the process goes to Step S14. In this way, as long as there is no detection of departure acceleration and there is no detection of getting out through the ticket examiner, Step S14 and Step S16 are repeated, so as to wait for departure of the train that the owner of the mobile phone 2 takes after entering through the ticket examiner.

If departure acceleration is detected in Step S14, the process goes to Step S18 in which an getting-off station detection process is performed. This is a process necessary for urging the owner of the mobile phone 2 to get off the train at the getting-off station and announce him or her not to ride past because of napping or thinking. When it is decided that the getting-off station is detected, a detection flag is set. The detail will be described later. In Step S18, it is checked whether or not an getting-off station detection flag is set in the getting-off station detection process of Step S20. Then, if the getting-off station detection flag is set, the process goes to Step S22, the getting-off station notification process is performed. This is a process for announcing the getting-off station detection to the owner of the mobile phone 2, and details thereof will be described later. An getting-off station pre-detection flag is reset, and train confirmation information and an estimated getting-off station are erased before going to the next Step S24.

In Step S24, it is checked whether or not the departure acceleration is detected in a predetermined time from the announcement. This is a check whether the owner of the mobile phone 2 rode past despite of the announcement of the getting-off station or the train that the owner of the mobile phone 2 changed as a schedule has departed. If the departure acceleration is not detected in a predetermined time, the process goes to Step S26, and it is checked whether or not the owner of the mobile phone 2 has got out through the ticket examiner of the getting-off station in another predetermined time after that. If it is detected in Step S26 that the owner of the mobile phone 2 has got out through the ticket examiner of the getting-off station, the process goes to Step S28 in which information indicating that the owner of the mobile phone 2 has passed through the ticket examiner of the getting-off station is transmitted to the ticket examiner machine 48 of the getting-off station, and the process flow is finished. Further, similarly to the case of Step S8, the transmitted ticket examiner passage information at the getting-off station is transmitted by e-mail via the Internet together with the IP address from the ticket examiner control unit 50 of the getting-off station via the station server 40 of the getting-off station to the pre-enrolled destination. For instance, a family of the owner of the mobile phone 2 can know that he or she has got out the getting-off station.

On the other hand, if it is not confirmed in Step S20 that the getting-off station detection flag is set, or if the departure acceleration is not detected in a predetermined time in Step S24, or if the getting out through the ticket examiner is not detected in a predetermined time in Step S26, the process goes to Step S30 so as to perform a GPS correction process. This process is a process of confirming whether or not the getting-off station to be detected in Step S18 should be changed on the basis of information from the GPS unit 14 and correcting the same if necessary. Details thereof will be described later. When the GPS correction process is finished in Step S30, it is checked in Step S32 whether or not the owner of the mobile phone 2 has got out through the ticket examiner. This is a countermeasure against the case where the process goes from Step S26 to Step S30 as a result that the owner of the mobile phone 2 did not get out through the ticket examiner of the getting-off station in a predetermined time for a certain reason. Here, if the getting out through the ticket examiner is detected, the process goes to Step S28 so as to perform the same process as the case where the process goes to Step S28 via Step S26.

On the contrary, if the getting out through the ticket examiner is not detected in Step S32, the process goes back to Step S18, and repeats the loop of Step S18 to Step S26, Step S30, and Step S32 unless the getting-off station is detected in Step S20, or the departure acceleration is not detected in Step S24, or the getting out through the ticket examiner is detected in Step S26 or Step S32.

In addition, if the getting out through the ticket examiner is detected in Step S16, the process goes to Step S34 in which information indicating that the owner of the mobile phone 2 once entered through the ticket examiner of the getting-on station but got out through the ticket examiner without getting on the train is transmitted to the ticket examiner machine 48, and the process flow is finished. Further, in this case too, similarly to the case of Step S8, the information indicating getting out through the ticket examiner of the getting-on station is transmitted by e-mail via the Internet together with the IP address from the ticket examiner control unit 50 via the station server 40 to the pre-enrolled destination. For instance, a family of the owner of the mobile phone 2 can know that he or she did not get on the train because of a certain reason at the getting-on station. Note that if entering through the ticket examiner is not detected in a predetermined time in Step S6, it means that the owner of the mobile phone 2 was not allowed to pass through the ticket examiner in Step S4, or he or she did not enter through the ticket examiner by his or her intention. Therefore, the process flow is finished promptly.

Further, in the period while the above-mentioned loop of Step S14 and Step S16 is repeated, it seems that any other function is not performed. However, this is because of simplification of the description of the process flow, and Step S14, Step S16, Step S24, Step S26, and Step S32 are steps of watching presence or absence of interrupt. Specifically, for example, when the process goes through Step S12, interrupt of departure acceleration detection in Step S14 is enabled. If the interrupt is detected, the process goes to Step S18. In addition, interrupt of the getting out through the ticket examiner in Step S16 is enabled unless the interrupt of the departure acceleration detection is detected in Step S14 via Step S12. If the interrupt of the getting out through the ticket examiner is detected, the process goes to Step S34. Further, as a matter of course, the interrupts in Step S14 and in Step S16 are disabled until the process goes via Step S12. In addition, if the process goes to Step S18 or Step S34 by the interrupt detection in Step S14 or in Step S16, the interrupts in Step S14 and Step S16 are both disabled. As described above, the mobile control unit 4 can perform other functions while waiting the interrupt in Step S14 or in Step S16 via Step S12.

In the same manner, Step S20, Step S24, Step S26, and Step S32 are steps watching presence or absence of interrupt in real. The interrupt is enabled in the steps just before them and is disabled when the process goes to the next step by the interrupt detection. Thus, the mobile control unit 4 can perform other functions while the loop of Step S18 to Step S26, Step S30, and Step S32 is repeated. Hereinafter, although description is omitted, in the process flow illustrated in the diagram, the steps having detection that may occur at unknown timing should be understood to be interrupt detection steps in the same manner.

Figure 3:
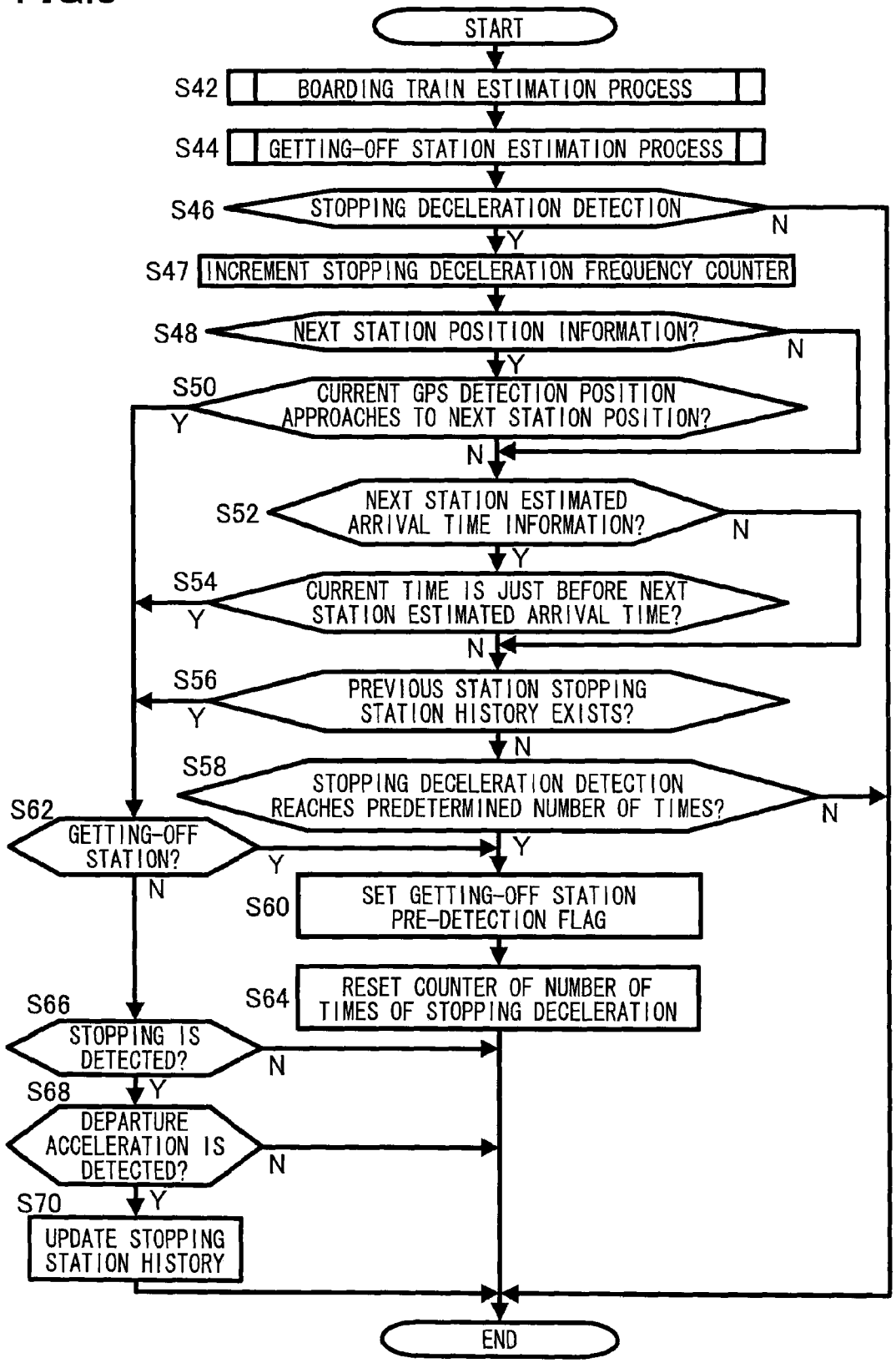
FIG. 3 is a flowchart illustrating details of Step S18 illustrated in FIG. 2.

FIG. 3 is a flowchart illustrating details of the getting-off station detection process in Step S18 illustrated in FIG. 2. When the process flow starts, a boarding train estimation process is performed in Step S42. Details thereof will be described later. When the train on which the owner of the mobile phone 2 got is estimated in Step S42, the process goes to Step S44 in which the getting-off station estimation process is performed. Note that as to this getting-off station, if changing trains is necessary until reaching the final destination, an getting-off station for changing trains is estimated. Details of the getting-off station estimation process in Step S44 will be described later. When the getting-off station is estimated in Step S44, the process goes to Step S46.

In Step S46, it is checked whether or not deceleration of the train for stopping at the next station is detected by the acceleration sensor 26. The train reduces its speed not only for stopping but also for other reason appropriately. It is decided whether or not the deceleration is for stopping on the basis of comparison with a deceleration pattern for stopping that is stored in advance. If stopping deceleration is detected in Step S46, a stopping deceleration frequency counter is incremented in Step S47, and the process goes to Step S48 in which it is checked whether or not information of the next station position after necessary update in Step S10 illustrated in FIG. 2 is stored in the storage unit 10. Then, if the next station position information is stored, the process goes to Step S50 in which the current position obtained from the GPS unit 14 at the time point when the stopping deceleration is detected is close to the next station position within a predetermined distance.

If the approach to the next station is not detected in Step S50, it is considered that there was a certain malfunction in obtaining the next station position information, the stopping deceleration detection, or the GPS information, and therefore the process goes to Step S52. In addition, if the next station position information is not detected in Step S48, the process goes directly to Step S52. In Step S52, it is checked whether or not information of estimated time of arrival to the next station after necessary update in Step S10 illustrated in FIG. 2 is stored in the storage unit 10. If the next station estimated arrival time information is stored, the process goes to Step S54 in which it is checked whether or not the current time when the stopping deceleration is detected is within a predetermined time to the next station estimated arrival time.

If it is not detected in Step S54 that the current time is just before the next station estimated arrival time, it is considered that there is a certain malfunction in the next station estimated arrival time information or in the stopping deceleration detection, and therefore the process goes to Step S56. In addition, if the next station estimated arrival time information is not detected in Step S52, the process goes directly to Step S56. In Step S56, it is checked whether or not there is a stop history of the previous station. If it is not checked there is, the process goes to Step S58 in which it is checked whether or not the number of times of the stopping deceleration detection that is counted in Step S47 has reached a predetermined number of times. If it has reached a predetermined number of times, the process goes to Step S60.

On the other hand, if the approach to the next station is detected in Step S50, the process goes to Step S62 in which it is checked whether or not the approaching next station is the getting-off station. This is performed on the basis of the getting-off station estimation in Step S44, and the route chart and timetable information after necessary update in Step S10 of FIG. 2. Then, if it is confirmed in Step S62 that the approaching next station is the getting-off station, the process goes to Step S60. In addition, if it is detected in Step S54 that the current time is just before the next station estimated arrival time, the process also goes to Step S62 in which it is checked whether or not the next station just before the estimated arrival time is the getting-off station. Then, if it is confirmed that it is the getting-off station, the process goes to Step S60.

Further, if the history is confirmed in Step S56 which indicates that the train has stopped correctly in the previous station, the process also goes to Step S62 in which it is checked whether or not the next station is the getting-off station. Then, if it is confirmed that it is the getting-off station, the process goes to Step S60. If the process goes from Step S56 to Step S62, it has not been confirmed that the stopping deceleration detected in Step S46 is due to the approach to the next station, but at least stopping in the previous station is confirmed. Therefore, although there is a small possibility of the deceleration due to an accident before the next station, the deceleration is regarded to be due to the approach to the next station that the process goes to Step S62. Then, if it is confirmed in Step S62 that the next station is the getting-off station, the process goes to Step S60.

In Step S60, an getting-off station pre-detection flag is set, so as to prepare for the getting-off station notification process in Step S22 after Step S20 illustrated in FIG. 2. Further, if the number of times of stopping deceleration detection reaches a predetermined number of times in Step S58 as described above, the process also goes to Step S60 in which the getting-off station pre-detection flag is set. This case corresponds to the case where there is no information except the checking in Step S58. By setting the above-mentioned predetermined number of times to the number of stopping way stations until the getting-off station, when the stopping deceleration detection reaches a predetermined number of times, it is regarded to be the deceleration for stopping at the getting-off station, and the process goes to Step S60. If a deceleration occurs in other place than stations due to an accident or a disturbance in the diagram and is counted, the number of times of stopping deceleration detection may reach the predetermined number of times before reaching the getting-off station. Still, in this case, it is decided to be the deceleration for stopping at the getting-off station for safety. Note that if the decision may be an error as described above, a form of the announcement in the getting-off station notification process in Step S22 illustrated in FIG. 2 is changed as described later.

When the setting of the getting-off station pre-detection flag is completed in Step S60, the process goes to Step S64 in which the stopping deceleration frequency counter is reset, and the process flow is finished. Further, if the stopping deceleration is not detected in Step S46, or if it is not detected that the stopping deceleration detection in Step S58 has reached a predetermined number of times, the process flow is finished promptly.

In addition, if it is not detected that the stopping deceleration detection is for the getting-off station in Step S62, it means that the deceleration is for stopping at a way station. Therefore, the process goes to Step S66 in which it is checked whether or not the stopping at the station is detected by the acceleration sensor 26. The detection of stopping is performed on the basis of verification with an acceleration variation pattern stored in advance that is decided to be stopping, and lapse time from the detection in Step S46. Then, if the stopping is not confirmed, it means that the train did not stop actually after the stopping deceleration. Therefore, the process flow is finished promptly. On the other hand, if the stopping is confirmed, the process goes to Step S68 in which it is checked whether or not the departure acceleration is detected in a predetermined time after the stop detection. Then, if the acceleration is detected, the stop and the restart at the way station can be confirmed as described above. Therefore, the process goes to Step S70 in which a stopping station passing through history is updated, and the process flow is finished. Further, if the departure acceleration in a predetermined time after stopping is not detected in Step S68, a case of an accident of the train itself, a case where the owner of the mobile phone 2 got off the train at the station though it was not the getting-off station, and other various cases can be considered. Therefore, the process flow is finished promptly.

The process flow itself illustrated in FIG. 3 is executed only once from its start to finish without repetition. Then, after the process flow finishes, the process goes to Step S20 in FIG. 2 in which presence or absence of the getting-off station pre-detection flag is checked. If the flag is not checked, the process goes back to Step S18 via Step S30 and Step S32. Therefore, in the repetition of the loop, the process flow illustrated in FIG. 3 is executed once every time in Step S18. Thus, the getting-off station detection process illustrated in FIG. 3 that is a specific process in Step S18 functions repeatedly unless the getting-off station pre-detection flag is detected in Step S20 illustrated in FIG. 2 or the getting out through the ticket examiner is detected in Step S32, so as to prepare for an approach of the train to the getting-off station. Note that if the process goes to Step S70 via Step S56, there is small possibility that update of stopping station history causes an error. The correction thereof will be described later.

Figure 4:
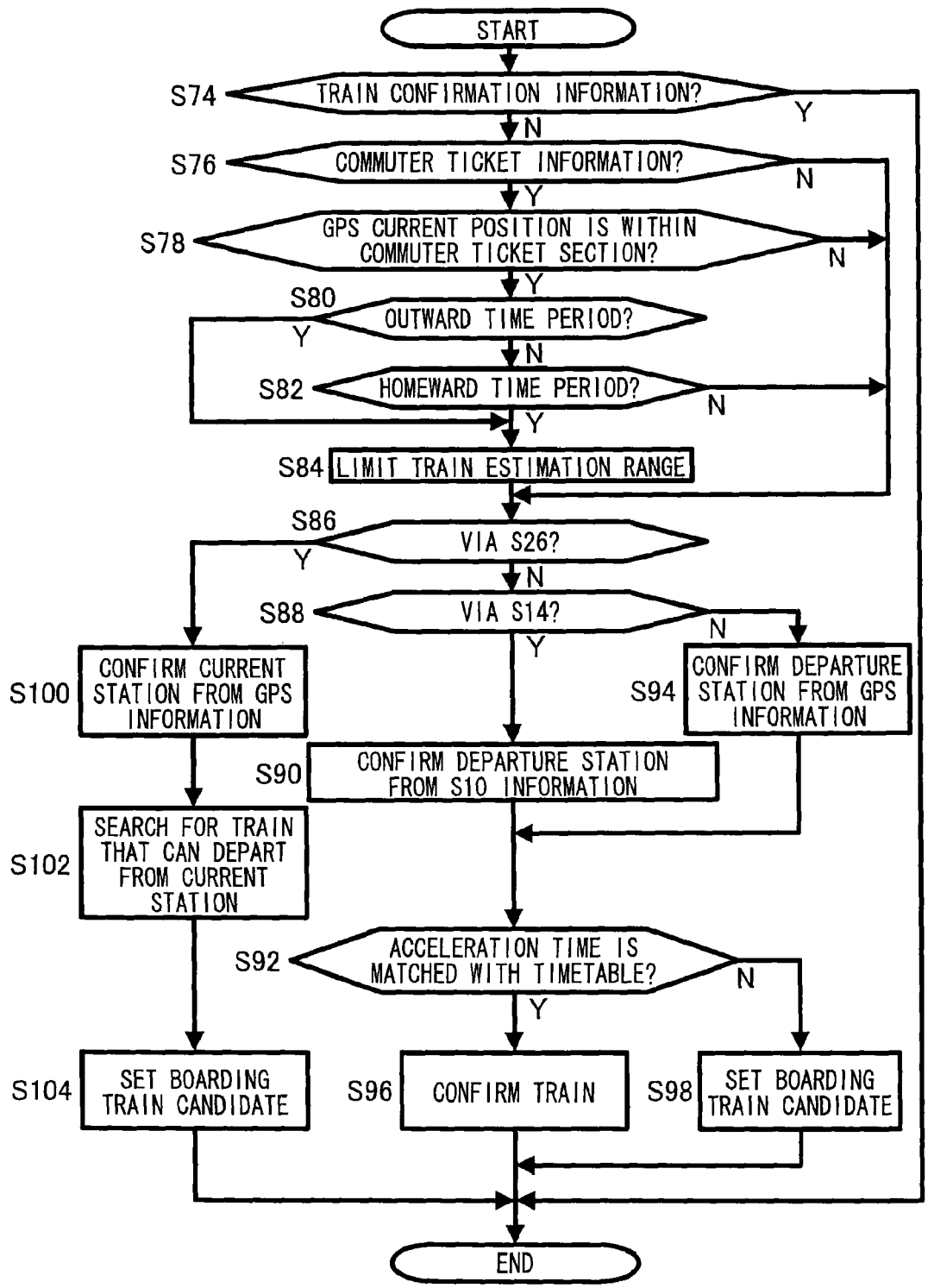
FIG. 4 is a flowchart illustrating details of Step S42 illustrated in FIG. 3.

FIG. 4 is a flowchart illustrating details of the boarding train estimation process in Step S42 illustrated in FIG. 3. When the process flow is started, presence or absence of boarding train confirmation information is checked in Step S74. The case where there is train confirmation information means a case where the process goes via Step S18 illustrated in FIG. 2 at least once, and via the boarding train estimation process in Step S42 illustrated in FIG. 3. On the other hand, the case where there is no train information means a case where the process goes to Step S18 first time after the entrance through the ticket examiner in the process flow illustrated in FIG. 2 or a case where the boarding train confirmation information is erased by the procedure that will be described later. If the train information is detected in Step S74, the process goes to Step S76.

In Step S76, it is checked whether or not the commuter ticket information is stored in the storage unit 10 illustrated in FIG. 1. Then, if the commuter ticket information is stored, it is checked whether or not the current position is within a commuter ticket section on the basis of information from the GPS unit 14 illustrated in FIG. 1. If it is within the section, the process goes to Step S80 in which it is checked whether or not the current time is in an outward time period using a commuter ticket. As a result, if it is not in the outward time period, the process goes to Step S82 in which it is checked whether or not the current time is in a homeward time period. If it is true, the process goes to Step S84. In addition, if it is detected in Step S80 that it is the outward time period, the process goes directly to Step S84. Note that the outward time period and the homeward time period are set automatically by learning the time of day of passing through the ticket examiner every day, but it is possible to set the same manually with higher priority. These setting results are stored in the storage unit 10 illustrated in FIG. 1 for comparing with the current time in Step S80 and in Step S82.

In Step S84, it is regarded that the owner of the mobile phone 2 is in a train in the time period of daily route using the commuter ticket on the basis of the confirmation of being the outward time period or the homeward time period, and a train estimation range is limited to the range corresponding to the same. Then, the process goes to Step S86. On the other hand, if the commuter ticket information is not detected in Step S76, or if the GPS current position is not in the commuter ticket section in Step S78, or if it is not either the outward time period or the homeward time period after the process from Step S80 via Step S82, the process goes directly to Step S86.

In Step S86, it is checked whether or not the process reached to Step S18 via Step S26 illustrated in FIG. 2. Via Step S26 means the case where the process goes to Step S30 without the acceleration or getting out through the ticket examiner in a predetermined time after the getting-off station announcement and goes back to Step S18. This means a situation of waiting a train to get on next after getting off the train at the station that was announced, or a situation staying in the getting-off station for a certain reason. If it is not detected that the process went via Step S26, the process goes to Step S88 in which it is checked whether or not the process reached the Step S18 via Step S14 illustrated in FIG. 2. Via Step S14 means a case the process goes to Step S18 first time after entering through the ticket examiner. Therefore, it is certain that the train has departed the station of the entrance through the ticket examiner if the process went via Step S14. Therefore, the process goes to Step S90 in which the departure station is confirmed on the basis of station information obtained in Step S10. Then, the process flow goes to Step S92. On the other hand, if it is not detected in Step S88 that the process went via Step S14, it means that the process went back to Step S18 via Step S24. This means to have ridden past the announced station and the train has departed or that the train to get on next has departed. Therefore, the process goes to Step S94 in this case, in which the departure station is confirmed from position information obtained from the GPS unit 14, and the process goes to Step S92.

In Step S92, it is checked whether or not the time when the acceleration is detected in Step S14 illustrated in FIG. 2 agrees with departure time of any train in the timetable. Then, if they agree with each other, the process goes to Step S92 in which it is estimated that the train is the boarding train on the basis of the station information and the departure time, and the process flow is finished. On the other hand, if there is no train of the departure time that agrees with the acceleration time on the timetable in Step S92, it is estimated that the diagram is confused. Therefore, the process goes to Step S98 in which a plurality of train candidates that may be boarded are set from the original timetable, and the process flow is finished.

If it is detected in Step S86 that the process went via Step S26, it corresponds to the situation described above, in which the owner of the mobile phone 2 stays at the getting-off station for a certain reason. Therefore, the process goes to Step S100 in which the current station is confirmed from the GPS information. Next, trains that can depart the current station after the time are searched for in Step S102. These trains include a returning train in the case where owner of the mobile phone 2 gets off the train after riding past, or a train to be waited for long time to get on next. Current station information, time information, timetable information, and commuter ticket information if necessary, are used for searching for the plurality of train candidates that can be taken. Then, the boarding train candidates retrieved in Step S104 are set, and the process flow is finished. Further, if the estimated trains are not confirmed when the process flow illustrated in FIG. 4 is finished, the candidates are narrowed down including the boarding train in the getting-off station estimation process of Step S44 following the boarding train estimation process of Step S42 illustrated in FIG. 3.

Figure 5:
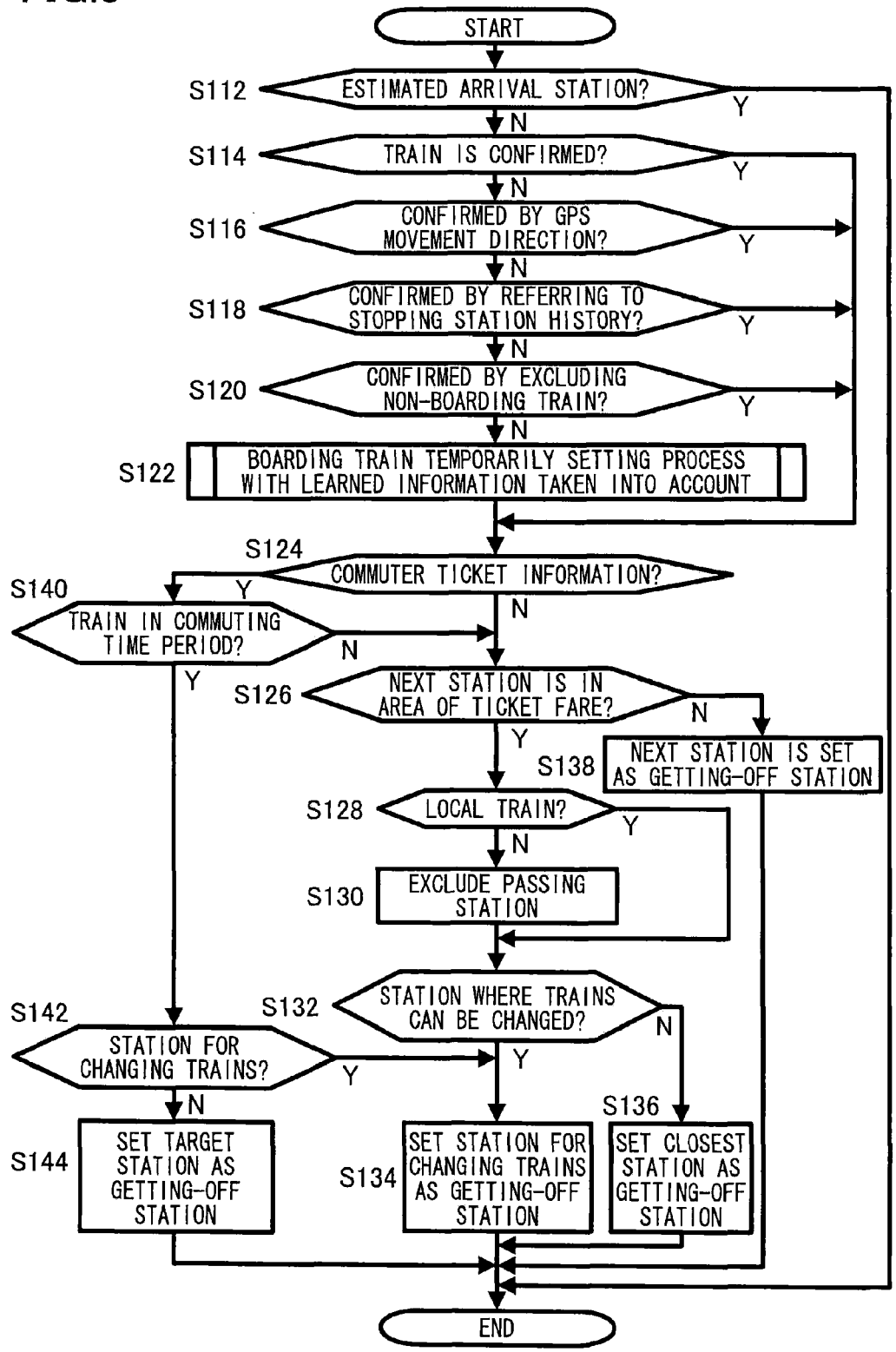
FIG. 5 is a flowchart illustrating details of Step S44 illustrated in FIG. 3.

FIG. 5 is a flowchart illustrating details of the getting-off station estimation process in Step S44 illustrated in FIG. 3.

When the process flow starts, presence or absence of the estimated getting-off station information is checked in Step S112. Then, if this information is missing, the process goes to Step S114 and the succeeding steps so as to determine the estimated getting-off station. The case where the estimated getting-off station information is missing is a case where the process reaches the getting-off station detection process in Step S18 first time via Step S14 illustrated in FIG. 2, or a case where the estimated getting-off station information is erased as a result of the getting-off station notification process performed after reaching the original estimated getting-off station. The latter case occurs in changing the train or in riding past.

In Step S114, it is checked whether or not the boarding train is decided in the boarding train estimation process prior to the getting-off station estimation process. The case where it is not decided means a case where a plurality of train candidates are set in Step S98 or in Step S104. In this case, the process goes to Step S116 in which it is checked whether or not the boarding train can be decided on the basis of movement direction based on GPS information history. This check is effective for discriminating whether it is an up train or a down train, or for discriminating in which direction the train is headed in the case where the line is branched. However, by this check, the narrowing down cannot be performed in the case where the plurality of candidates are trains heading the same direction of the same line.

If the boarding train is not decided in Step S116, the process goes to Step S118 in which it is checked whether or not the boarding train can be decided with reference to the stopping station history. This is effective for discriminating whether the train is an express train or a local train. If the boarding train is not decided in Step S118, the process goes to Step S120 in which it is checked whether or not the boarding train can be decided by excluding trains that were not used. This is, for example, a case where there are train candidates of different departure times, and because the train of earlier departure time is not used, the train to be get on is decided to be the train of later departure time. If the boarding train is not decided also in Step S120, the process goes to Step S122.

In Step S122, a process of setting one boarding train temporarily is performed by a predetermined estimation logic in which learned information of past boarding history of the owner of the mobile phone 2 is taken into account, so that the boarding train is decided, the process goes to Step S124. In addition, if the boarding train is decided in any one of Step S112, Step S114, Step S116, Step S118, and Step S120, the process goes to Step S124 promptly at the time.

In Step S124, presence or absence of the commuter ticket information is checked. If the information is missing, it means boarding by using a ticket, so the process goes to Step S126. In Step S126, it is checked whether or not the next station is within an area of the ticket fare on the basis of ticket information, current position information, and route information. Then, if it is within an area of the ticket fare, the process goes to Step S128 in which it is checked whether or not the train is a local train on the basis of boarding train information. If it is not true, it means that the train is an express train or the like, so the process goes to Step S130 in which the train to passes through without stopping is excluded from target stations, and the process goes to Step S132. On the other hand, if it is detected in Step S128 that the train is a local train, the process goes directly to Step S132.

In Step S132, it is checked whether or not there is a station for changing trains in the area of the ticket fare. If there is a corresponding station, the process goes to Step S134 in which the station for changing trains that is closest is set as the estimated getting-off station, and the process flow is finished. On the other hand, if there is no station for changing trains in the area of the ticket fare in Step S132, the process goes to Step S136 in which the closest station in the area of the ticket fare is set as the estimated getting-off station, and the process flow is finished. Note that the closest station in the area of the ticket fare means a station that is closest except for station that can be reached by fare lower than the fare of purchased ticket by one step. In other words, it is the station among stations for which the ticket should be purchased. Step S134 and Step S136 are the process in which the estimated getting-off station is set as a station having a possibility of getting off by ticket boarding, if there is, for safety, so that the announcement is performed when reaching the station. As a matter of course, the station may not be the desired getting-off station, but it is surely a station close to the getting-off station based on the range of the ticket fare, so that the above-mentioned estimation is performed.

On the other hand, if it is decided in Step S126 that the next station is not in the area of the ticket fare, the process goes to Step S138 in which the next station is regarded as the estimated getting-off station, and the process flow is finished. This is because there is high possibility that the owner of the mobile phone 2 rode past the getting-off station, so that it is considered to be appropriate to notify to get off the train at the next station.

In addition, if the commuter ticket information is detected in Step S124, the process goes to Step S140 in which it is checked whether or not the train is a train in a time period for commuting by using a commuter ticket. If it is not a train in the time period, it is not always true that the owner of the mobile phone 2 is heading to the everyday getting-off station determined by the commuter ticket. Therefore, the process goes to Step S126 in which the same process as the above-mentioned ticket boarding is performed. On the other hand, if it is decided in Step S140 that the train is a train in the commuting time period, the process goes to Step S142 in which it is checked whether or not there is a station for changing trains. Then, if it is decided that there is a station for changing trains, the process goes to Step S134 in which the station for changing trains is regarded as the estimated getting-off station, and the process flow is finished. If the process goes to Step S134 from Step S132, the station for changing trains is not necessarily the desired getting-off station. But if the process goes to Step S134 via Step S142, the station for changing trains is the real getting-off station indicated in the commuter ticket boarding. On the other hand, if it is decided in Step S142 that there is no station for changing trains on the way, the process goes to Step S144 in which the target station in the commuter ticket information is regarded as the estimated getting-off station, and the process flow is finished. Also in this case, the estimated getting-off station is the real getting-off station in the commuter ticket boarding. Further, in Step S144, in both end stations in the section of the commuter ticket information, the station that does not correspond to the getting-on station information obtained in Step S12 illustrated in FIG. 2 is estimated as the target station. Further, instead of this, it is possible to decide which one of the end stations in the commuter ticket section is appropriate to be regarded as the target station on the basis of the current position information obtained from the GPS unit 14. Further, it is possible to discriminate whether it is on the way to work or the way to home on the basis of the current time information, so as to decide which one of the end stations in the commuter ticket section is appropriate to be regarded as the target station. Further, if the boarding train is estimated after changing train, it is possible to decide which one of the end stations in the commuter ticket section is appropriate to be regarded as the target station, on the basis of a result of the boarding train estimation.

Figure 6:
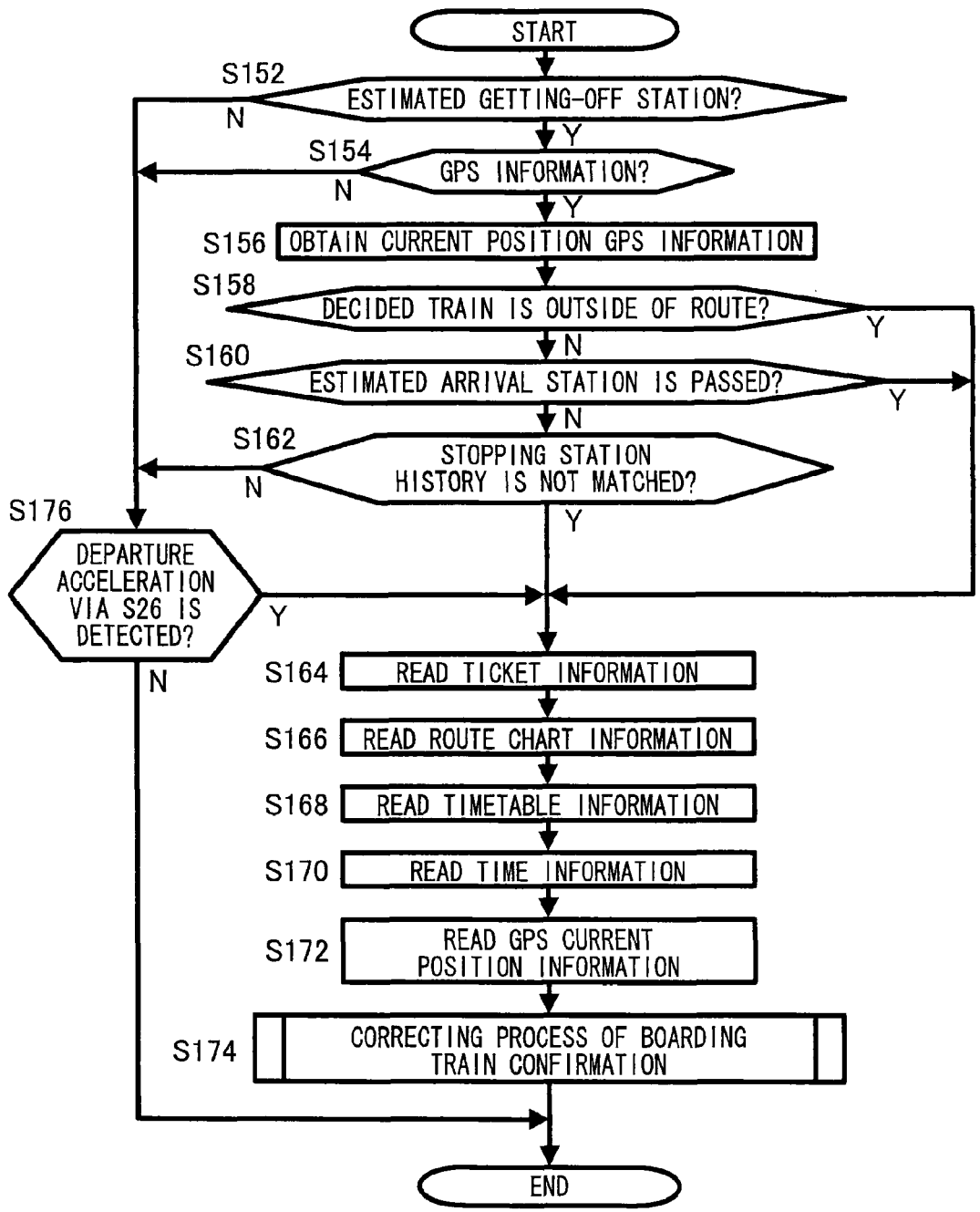
FIG. 6 is a flowchart illustrating details of Step S30 illustrated in FIG. 2.

FIG. 6 is a flowchart illustrating details of the GPS correction process in Step S30 illustrated in FIG. 2. When the process flow starts, it is checked whether or not the estimated getting-off station is set in Step S152. If the estimated getting-off station is set, it means that the boarding train is decided. The process flow illustrated in FIG. 6 is performed for correcting error if there is in deciding of the boarding train. This function is provided for a main purpose of correcting error because there may be error in the decided train that is decided temporarily in Step S122, but it can also support a case where there is error about the train decided by a normal process.

If it is detected in Step S152 that the estimated getting-off station is set, it is checked in Step S154 whether or not the GPS information is available. If it is available, the process goes to Step S156 in which GPS information of the current position is obtained. Next, it is checked in Step S158 whether or not the current position has moved to the outside of the route of the decided train on the basis of the GPS information. If it is true, it means that a train of a route that is not the real one is decided as the boarding train. If it is not true in Step S158, the process goes to Step S160 in which it is checked whether or not the owner of the mobile phone 2 rode past the estimated getting-off station. This corresponds to the case, for example, where a train stopping in each station is decided as the boarding train, but actually the owner of the mobile phone 2 is in the express train that passes through the estimated getting-off station. In this case, even if the estimated getting-off station is close, the stopping deceleration is not detected.

If it is not true in Step S160, the process goes to Step S162 in which it is checked whether or not the stopping station history does not agree with a diagram of the train that is decided as the boarding train. This also occurs when a wrong train is decided as the boarding train. If it is true in Step S162, the process goes to Step S164. Note that the process goes to Step S164 also in the case where it is true in Step S158 or in Step S160.

In Step S164, the ticket information of the commuter ticket or the ticket is read out. After that, the route chart information is read out in Step S166, the timetable information is read out in Step S168, the time information is read out in Step S170, and the GPS current position information is read out in Step S172. In Step S174, a correcting process of the decided boarding train is performed on the basis of the above-mentioned pieces of information, and the process flow is finished.

On the other hand, if the setting of the estimated getting-off station is not detected in Step S152, the process goes to Step S176. In Step S176, it is checked whether or not the departure acceleration is detected in the case where the process goes to the GPS correction process in Step S30 via Step S26 illustrated in FIG. 2. The case where the departure acceleration is detected corresponds to, for example, the case where the owner of the mobile phone 2 got off the train at the station in accordance with the getting-off station notification process in Step S22, waited relatively long time for a forward or backward train to get on next, and the train arrived and restarted after the owner of the mobile phone 2 got on. Such the acceleration detection is critical information for the boarding train confirmation. Therefore, the process goes to Step S164, and then Steps S164 to S174 are executed so as to decide the boarding train. On the other hand, if the acceleration is not detected in Step S176, the process flow is finished promptly. In this case, the process goes back to Step S18 illustrated in FIG. 2, and the boarding train is decided by Step S104.

Note that if GPS information of the current position is not obtained in Step S154, the process goes to Step S176. In this case, if the departure acceleration is detected in Step S176, the boarding train confirmation can be corrected even if the GPS information is missing. Therefore, the process goes to Step S164. In addition, if the disagreement of the stopping station history is not detected in Step S162, the process also goes to Step S176. In this case, it means that any of various illogicalities in the boarding train confirmation based on the GPS information is not detected. Therefore, it is not necessary to correct the boarding train confirmation, and it is usually supposed that process flow if finished promptly. However, in this case too, if the departure acceleration is detected in Step S176, the process goes to Step S164 in which the boarding train is confirmed to make it sure.

Figure 7:
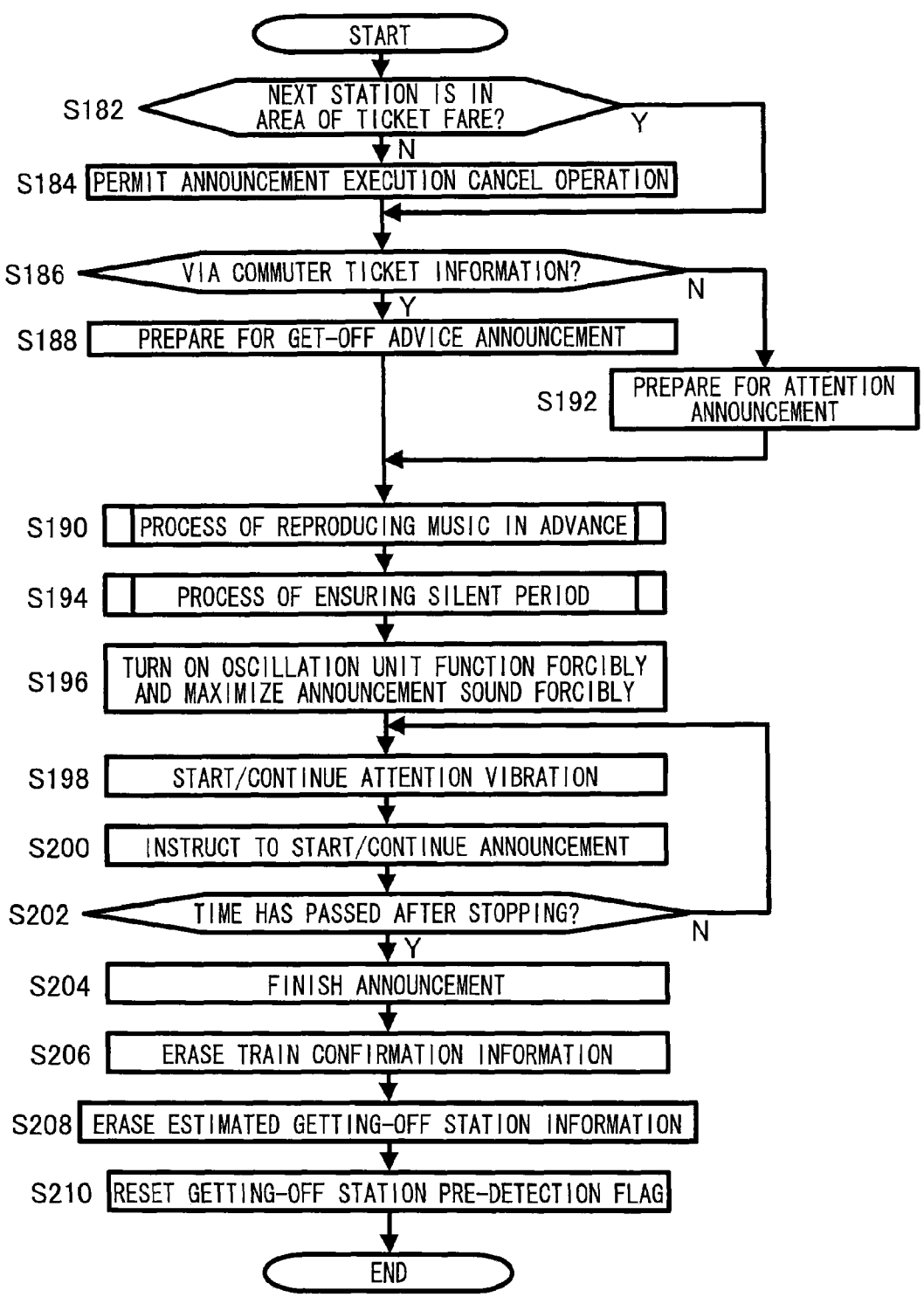
FIG. 7 is a flowchart illustrating details of Step S22 illustrated in FIG. 2.

FIG. 7 is a flowchart illustrating details of the getting-off station notification process in Step S22 illustrated in FIG. 2. When the process flow starts, it is checked in Step S182 whether or not the next station is in the area of the ticket fare. Then, if it is not in the area of the ticket fare, the process goes to Step S184 in which announcement execution cancel operation is allowed. This example of the present invention is aimed at announcing an approach of the getting-off station to the owner of the mobile phone 2 who does not notice the approach because of napping or thinking. Therefore, it is designed to turn on the announcement function forcibly in usual case, even if the owner sets the mobile phone 2 in any manner. In other words, cancellation of the announcement function by the owner of the mobile phone 2 is not allowed in usual case. However, if it is detected in Step S182 that the next station is not in the area of the ticket fare, the owner of the mobile phone 2 has already ridden over. Therefore, in this state, if the owner of the mobile phone 2 wants to cancel the announcement function, it is considered that he or she has ridden over intentionally. In this case, if the announcement execution cannot be canceled so that the announcement is repeated, the owner of the mobile phone 2 may be bothered. Therefore, the canceling operation is allowed in Step S184, and the process goes to Step S186. On the other hand, if the next station is in the area of the ticket fare in Step S182, the process goes directly to Step S186, so that the announcement execution cannot be canceled as the initial design concept.

In Step S186, the history whether or not the process goes to the getting-off station announcement via the commuter ticket information is checked. "Via the commuter ticket information" means the case where the getting-off station pre-detection flag is set in Step S60 illustrated in FIG. 3 concerning the estimated getting-off station set in Step S144 illustrated in FIG. 5 or the estimated getting-off station set in accordance with a result of reaching Step S134 via Step S140. If it is true, the process goes to Step S188 in which the get-off advice announcement is prepared, and the process goes to Step S190. On the other hand, if "via the commuter ticket information" is not detected in Step S186, the process goes to Step S192 in which attention announcement is prepared, and the process goes to Step S190. This announcement alerts attention about possibility of reaching the getting-off station, and is different from the announcement in Step S188 so as to enhance reliability of the announcement corresponding to the situation.

In Step S190, prior to the announcement, a music reproducing process is performed for a predetermined time (e.g., for 30 seconds) in advance. Note that if the music is already being reproduced, Step S190 becomes a step of counting a predetermined time. Then, after a predetermined time passes in Step S190, a process of securing a silent state of a predetermined short period (e.g., two seconds) is performed in Step S194. Next in Step S196, function of the vibration unit 20 illustrated in FIG. 1 is forcibly turned on, and audio volume of the announcement is forcibly maximized Thus, even if the owner of the mobile phone 2 has turned off vibration function, the vibration function is forcibly enabled. In addition, if the owner of the mobile phone 2 has set the audio volume of the earphone to be low, the announcement is performed at the maximum audio volume. After that, the process goes to Step S198 in which the attention vibration is started. Simultaneously, the announcement is started in Step S200. After the vibration and the announcement are started, the process goes to Step S202 in which it is checked whether or not a predetermined time has passed after the train stopped. Then, if the predetermined time has not passed, the process goes back to Step S198, and the vibration and the announcement are continued until the predetermined time passes.

As described above, the music that is being reproduced is stopped so as to provide a short silent period before starting the vibration and the announcement, and afterward the vibration and the announcement are started, in order to waken up effectively the owner of the mobile phone 2 who is sleeping, for example. The point is ensuring the silent period in Step S194, in which the music that was continuously being reproduced is stopped so as to ensure the silent period, and afterward the announcement is performed. Thus, the stimulating effect by the announcement is enhanced. Therefore, the above-mentioned music may be reproduced continuously after boarding, and a predetermined time of reproduction when the process goes to Step S190 so as to start the reproduction may be any long period as long as the getting-off station announcement is in time.

If a lapse of a predetermined time is detected in Step S202 after the train stopped, the process goes to Step S204 in which the vibration and the announcement are stopped. After that, the train confirmation information is erased in Step S206, the estimated getting-off station information is erased in Step S208, the getting-off station pre-detection flag is reset in Step S210, and the process flow is finished. As described above, when the process goes to Step S30 via Step S24 or Step S26 illustrated in FIG. 2, a state occurs where the train confirmation information, the estimated getting-off station information, and the getting-off station pre-detection flag are missing. Note that it is needless to say that if the process goes to Step S30 via Step S20 illustrated in FIG. 2, it is the state with the train confirmation information and the estimated getting-off station information. The loop from Step S18 to Step S32 illustrated in FIG. 2 is repeated on the above-mentioned premise.

Various characteristics of the present invention described above are not limited to the example but can be used widely. For instance, if the stopping deceleration is not detected in Step S46 illustrated in FIG. 3, the getting-off station pre-detection flag is not set, and the process goes to Step S30 from Step S20 illustrated in FIG. 2. Further, the process goes to Step S160 illustrated in FIG. 6. If it is detected that the estimated getting-off station is passed through, the process of correcting the boarding train confirmation is performed in Step S164 to Step S174. This corresponds to the case where a train that is stopping in each station is decided as the boarding train, but actually the owner of the mobile phone 2 was on the express train that passes through the estimated getting-off station, for example, as described above. Therefore, the estimated train is corrected. In this way, the structure that can detect that the expected position is passed through without detecting the deceleration so as to perform the correction promptly is a useful characteristic that can be applied widely without limiting to the correction of the estimated train like the example. For instance, in a car navigation system, in spite of guiding to turn right in an intersection, it is supposed that the car actually runs straight without a deceleration. Then, in the case of only the GPS, correction of the guiding route is performed after detecting that the car passed through the intersection as position information. In contrast, taking the acceleration information into account as described above, traveling that does not follow the guidance can be detected in real time, so that the guiding route can be corrected promptly.

In addition, concrete means of the getting-off station estimation related to the various characteristics of the present invention are not limited to the example described above. For instance, information obtained from communication means with the train provided to the rail for controlling the train or communication means with the train provided to the station may be combined with the timetable information, the route information, the time information, and the like so as to estimate the getting-off station. In addition, concerning the estimation of the getting-off station, it is possible to estimate the boarding train from the above-mentioned information.

Further, in the example described above, the vehicle is the train and the place to get off is the station, but the effects of the various characteristics of the present invention are not limited to this. For instance, the vehicle may be a bus and the place to get off is a bus stop so as to embody the present invention in a useful manner.

In addition, the various characteristics related to the notification process in the example described above can be applied effectively not only to the announcement in advance about approach to the place to get off but also to announcement of time of a timer, wake-up announcement, or the like.

Hereinafter, various technical characteristics disclosed above will be summarized.

First, the first technical characteristic disclosed in this specification is related to mobile equipment such as a mobile device or a vehicle.

The mobile equipment such as a mobile device or a vehicle has various information detection functions such as the acceleration sensor or the GPS for various purposes.

However, there are still many problems to be studied for utilizing these functions.

The first technical characteristic disclosed in this specification provides, in view of the above discussion, mobile equipment that enhances effects of the equipped information detection function.

Specifically, this specification describes to provide a mobile equipment as an example of the above-mentioned first technical characteristic, which includes a storage unit for storing an acceleration variation pattern that is unique to a predetermined movement of the entire mobile equipment, a comparison unit which compares an acceleration variation detected by an acceleration detection unit with the acceleration variation pattern stored in the storage unit, and a decision unit which decides whether or not the entire mobile equipment had a predetermined movement on the basis of a result of the comparison by the comparison unit. Thus, it becomes possible to decide a movement of the entire acceleration detection equipment that is provided to the mobile equipment.

Note that the mobile equipment is a mobile device, for example, and the storage unit thereof stores the acceleration variation pattern that is unique to the vehicle on which the owner of the mobile device boards when the vehicle departs, and the decision unit decides the departure of the vehicle. Thus, it is decided that the owner of the mobile device has got on the vehicle surely.

In addition, if the mobile equipment is the mobile device, according to other concrete characteristics described in this specification, the storage unit stores the acceleration variation pattern that is unique to stopping of the vehicle on which the owner of the mobile device boards, and the decision unit decides the stopping of the vehicle in advance. Thus, stopping of the vehicle on which the owner of the mobile device boards is announced in advance, so that it is possible to prevent riding past or the like.

In addition, according to other characteristics described in this specification, a mobile equipment is provided, including an acceleration detection unit, a position detection unit which detects a position of the mobile equipment itself, and a decision unit which decides a movement of the entire mobile equipment on the basis of the acceleration detection unit and the position detection unit. Such a combination of the acceleration detection and the position detection enables to obtain more useful information than the case where the information pieces are used separately.

For instance, the decision unit decides whether or not the mobile equipment had moved to a predetermined position accompanying a predetermined acceleration variation. Thus, for example, it can be known in advance whether the mobile equipment is stopped, or is moving to turn left or right at a predetermined position. In addition, in another example, the decision unit decides whether or not the mobile equipment has passed through a predetermined position without a deceleration. Thus, it is possible to know promptly that the mobile equipment has passed straight through a predetermined position to stop or turn left or right. A preferred example of this mobile equipment is the case where the mobile equipment is a vehicle such as a car, a train, or the like.

In addition, according to other concrete characteristics described in this specification, the mobile equipment is a mobile device, and the decision unit decides whether or not the vehicle on which the owner of the mobile device boards has passed through a predetermined station without stopping. Thus, it is possible to know that the expected local train is actually an express train, for example. In addition, in another concrete example in which the mobile equipment is a mobile device, the decision unit estimates the vehicle on which the owner of the mobile device boards is decelerating so as to stop at a predetermined station. Thus, it is possible to announce the stop of the vehicle in advance to the owner of the mobile device so that riding past or the like can be avoided.

In addition, according to other characteristics described in this specification, a mobile equipment is provided, including an acceleration detection unit, an information obtaining unit which obtains information about the place where the mobile equipment itself is, and a decision unit which decides the place where the entire mobile equipment is on the basis of the acceleration detection unit and the information obtaining unit. This combination of the acceleration detection and the information obtaining unit enables to obtain more useful information than the case where the information pieces are used separately. Note that the information obtaining unit of this characteristic includes not only the function of obtaining information automatically but also the function of inputting information manually with an operation unit or the like.

In addition, according to a concrete characteristic described in this specification, there is provided a transmission unit which transmits a result of the decision made by the decision unit to the outside. Thus, it is possible to monitor a situation of the mobile equipment externally on the basis of the information obtained by the decision unit. For instance, if the mobile equipment is a mobile device, the behavior of the owner of the mobile device can be monitored in detail.

In addition, according to another concrete characteristic described in this specification, the mobile equipment is a mobile device, the information obtaining unit obtains entrance information of a departure/arrival place of the vehicle that the owner of the mobile device should board, and the decision unit decides boarding of the owner of the mobile device on the vehicle on the basis of the entrance information and departure acceleration detection by the acceleration detection unit. Thus, for example, not only the fact that the owner of the mobile device has enter through the ticket examiner of the station but also the fact that the owner has actually boarded the vehicle.

In addition, according to another concrete characteristic described in this specification, the mobile equipment is a mobile device, the information obtaining unit obtains expected arrival/departure information of the vehicle that the owner of the mobile device should board, and the decision unit decides boarding of the owner of the mobile device on the vehicle on the basis of expected departure information and acceleration detection time detected by the acceleration detection unit. Thus, for example, it is possible to specify not only the fact that the owner of the mobile device has entered through the ticket examiner of the station but also the vehicle that the owner has actually boarded.

Next, a second technical characteristic disclosed in this specification is related to a mobile device such as a mobile phone or a mobile information terminal.

A mobile device is equipped with various information and functions, and there are various proposals about associating the information and functions with boarding on a public transport facility including a vehicle such as a train or a bus.

However, there are still many problems to be studied for utilizing information and functions of mobile devices more effectively for boarding the public transport facility.

The second technical characteristic disclosed in this specification provides, in view of the above discussion, the mobile device that can utilize its information and functions for boarding on a public transport facility.

Specifically, this specification describes to provide a mobile device, as an example of the above-mentioned second technical characteristic, including a ticket information providing unit, an event information providing unit, and a control unit which estimates a place to get off the vehicle on the basis of information from the ticket information providing unit and the event information providing unit.

Thus, the station or the bus stop to get off can be automatically estimated in advance. The estimated place to get off can be used for announcement for preventing riding past, for example. According to the concrete characteristic, the ticket information providing unit provides information whether or not the ticket is a commuter ticket.

In addition, according to a concrete characteristic described in this specification, the information provided by the event information providing unit relates to an actually boarding vehicle, and the control unit erases places to get on or off at which the vehicle does not stop from estimation candidates on the basis of the information from the event information providing unit. Thus, reliability of the estimation of the place to get off is increased.

In addition, according to another concrete characteristic described in this specification, the ticket information unit provides fare information, the event information providing unit provides current position information, and the control unit estimates the next place to get on or off as the place to get off if the current position is outside the fare range, on the basis of the provided fare information and the current position information. Thus, the place to get off can be estimated promptly after riding past.

In addition, according to a concrete characteristic described in this specification, the event information providing unit includes a boarding time providing unit, and the control unit estimates one of the places to get on or off included in the commuter ticket information as the place to get off if the boarding time from the event information providing unit is in commuter ticket using time period. Even if commuter ticket information exists, if the use of the vehicle is not in usual commuter ticket using time period, the boarding is not always intended to get off at the place to get on or off included in the commuter ticket information. Therefore, after confirming that the boarding time is in the commuter ticket using time period, the commuter ticket information is utilized, so that reliability of the estimation of the place to get off can be increased.

In addition, according to another characteristic described in this specification, a mobile device is provided, including a ticket information providing unit, and a control unit which changes boarding information processing in accordance with whether or not the ticket information provided by the event information providing unit is a commuter ticket. Thus, the boarding information processing corresponding to the ticket information can be performed. A concrete example of the boarding information processing performed by the control unit is estimation of the place to get off the vehicle.

In addition, according to another characteristic described in this specification, a mobile device is provided, including a commuter ticket information providing unit, and a control unit which estimates the place to get off that is one of places to get on or off included in the commuter ticket information provided by the commuter ticket information providing unit. Thus, it is possible to perform an appropriate estimation of the place to get off by using the commuter ticket information.

Specifically, if the commuter ticket information includes a transfer place to get on or off, the transfer place to get on or off is estimated as the place to get off. In addition, as another concrete example, the control unit estimates the place to get off that is the one that is not the place to gent on among the places to get on or off on both ends of the boarding section of the commuter ticket information.

In addition, according to another characteristic described in this specification, a mobile device is provided, including a ticket information providing unit, and a control unit which estimates the place to get off that is the closest place to get on or off among a plurality of places to get on or off in the same fare section on the basis of the fare information included in the ticket information provided by the ticket information providing unit. Thus, also in the case of a normal ticket, an appropriate estimation of the place to get off can be performed. Although it is not always possible to narrow it down to one, it is possible to avoid riding past an expected getting-off place or estimating too many previous placed to get on or off as a candidate of the place to get off.

In addition, according to another characteristic described in this specification, a mobile device is provided, including a route information providing unit, and a control unit which estimates the place to get off that is the closest place to get on or off among a plurality of places to get on or off included in the route information provided by the route information providing unit. A place to get on or off for transferring is not limited to the final destination but may be a place to get off for transferring on the way, and it is more probable to be the getting-off station than the place to get on or off for transferring. Therefore, it is more appropriate to estimate as a candidate place to get off.

Next, a third technical characteristic disclosed in this specification is related to a mobile device such as a mobile phone or a mobile information terminal.

A mobile device has various pieces of information and functions, and various proposals have been made concerning utilization of such information and functions.

However, there are still many problems to be studied for utilizing information and functions of mobile devices more effectively.

The third technical characteristic disclosed in this specification provides, in view of the above discussion, a mobile device that can utilize information and functions effectively.

Specifically, as an example of the third technical characteristics, this specification describes to provide a mobile device including an acceleration detection unit, and a control unit which estimates arrival at the expected getting-off place of the vehicle on which the owner of the mobile device in advance on the basis of the detection of a predetermined acceleration by the acceleration detection unit. Thus, it is possible to estimate in advance the arrival at the expected getting-off place by actual acceleration variation of the vehicle on which the owner of the mobile device boards.

Note that according to detailed characteristic described in this specification, the control unit includes a counter which counts the number of times of predetermined accelerations detected by the acceleration detection unit, and estimates the arrival of the vehicle at the expected getting-off place on the basis of a count value of the counter. Thus, for example, stopping at places to get on or off on the way to the expected getting-off place is counted. When the count value reaches a predetermined value, it is decided that the acceleration detection this time is the deceleration for stopping at the expected getting-off place, so that the arrival at the expected getting-off place can be estimated in advance.

In addition, according to another detailed characteristic described in this specification, a position detection unit which detects the position of the mobile device itself is provided, and the control unit estimates the arrival of the vehicle at the expected getting-off place in advance on the basis of the detection of the position by the position detection unit and the detection of the predetermined acceleration by the acceleration detection unit. Thus, an approach to the expected getting-off place is confirmed by the position detection, and the predetermined acceleration is detected at the position, so that it is decided to be a deceleration for stopping at the expected getting-off place. Thus, arrival at the expected getting-off place can be estimated in advance.

In addition, according to more detailed characteristic described in this specification, a keeping unit of position information of the expected getting-off place of the vehicle is provided, and the control unit detects an approach of the vehicle to the expected getting-off place from position information of the keeping unit and a result of the position detection by the position detection unit. Then, on the basis of such approach detection and a detection of a predetermined acceleration by the acceleration detection unit, the arrival of the vehicle to the expected getting-off place is estimated in advance.

In addition, according to another detailed characteristic described in this specification, a current time information obtaining unit is provided, and the control unit estimates an arrival of the vehicle to the expected getting-off place in advance on the basis of the obtained current time information and a detection of the predetermined acceleration by the acceleration detection unit. Thus, an approach to the expected getting-off place is confirmed by the current time, and a predetermined acceleration at that time is detected, so that it is decided to be a deceleration for stopping at the expected getting-off place, thereby the arrival at the expected getting-off place can be estimated in advance. In addition, according to more detailed characteristic described in this specification, a keeping unit of timetable information of the vehicle is provided, and the control unit detects an approach of the vehicle to the expected getting-off place from the timetable information of the keeping unit and the current time information. Then, on the basis of the approach detection by this approach detection unit and predetermined acceleration detection by the acceleration detection unit, an arrival of the vehicle to the expected getting-off place is estimated in advance.

In addition, according to another detailed characteristic described in this specification, a keeping unit that keeps stop history information at a predetermined place to get on or off is provided, and the control unit estimates an arrival of the vehicle to the expected getting-off place in advance on the basis of the stop history information of the keeping unit and predetermined acceleration detection by the acceleration detection unit. Thus, it is decided to be a deceleration for stopping at the expected getting-off place by the acceleration detection in view of the stop history, so that the arrival at the expected getting-off place can be estimated in advance. An example that is preferred to such the estimation is, for example, the case where the stop history information kept in the keeping unit is a stopping result at the place to get on or off just previous the expected getting-off place.

In addition, according to another characteristic described in this specification, a mobile device is provided, including an acceleration detection unit which detects an acceleration exerted on the entire mobile device, a position detection unit which detects a position of the mobile device itself, and a control unit which estimates a next movement of the entire mobile device on the basis of a detection of a predetermined acceleration by the acceleration detection unit and a position detected by the position detection unit. In this way, by combining the detected current acceleration information and current position information as a whole, a next movement of the entire mobile device can be estimated more appropriately.

In addition, according to another characteristic described in this specification, a mobile device is provided, including an acceleration detection unit which detects an acceleration exerted on the entire mobile device, a current time information obtaining unit, and a control unit which estimates a next movement of the entire mobile device on the basis of a detection of predetermined acceleration by the acceleration detection unit and current time obtained by the current time information obtaining unit. In this way, by combining the detected current acceleration information and current time information as a whole, a next movement of the entire mobile device can be estimated more appropriately.

In addition, according to another characteristic described in this specification, a mobile device is provided, including an acceleration detection unit which detects an acceleration exerted on the entire mobile device, a keeping unit which keeps information concerning a plan of movement of the entire mobile device, and a control unit which estimates a next movement of the entire mobile device on the basis of a detection of predetermined acceleration by the acceleration detection unit and information kept by the keeping unit. In this way, by combining the detected current acceleration information and information concerning a plan of movement of the entire mobile device as a whole, a next movement of the entire mobile device can be estimated more appropriately.

The estimation results of the above-mentioned various control units can be combined with an announcement unit which announces the same, so that it is possible to provide the mobile device that can announce the estimation result to the owner. A preferred example of the announcement unit is, for example, an announcement by an audio output unit. In addition, another preferred example of the announcement unit is a vibration generation unit which generates a vibration or the like.

Next, a fourth technical characteristic disclosed in this specification is related to a mobile device such as a mobile phone or a mobile information terminal.

A mobile device has various pieces of information and functions, and various proposals have been made concerning utilization of such information and functions.

However, there are still many problems to be studied for utilizing information and functions of mobile devices more effectively.

The fourth technical characteristics disclosed in this specification provides, in view of the above discussion, a mobile device which can utilize the function for announcing the information to the owner of the mobile device.

Specifically, this specification describes, as an example of the fourth technical characteristics, to provide a mobile device including an announcement unit which performs announcement to the owner of the mobile device, and a control unit which foresees an arrival at the expected getting-off place of the vehicle on which the owner boards so as to generate a signal for controlling the announcement unit to perform the announcement, and resets the signal after the announcement unit performs the announcement. In this announcement, the owner does not always get off the vehicle at the expected getting-off place that is announced. It may occur intentionally or by overlooking. The above-mentioned characteristic of the present invention expects such the case and resets the signal for the announcement after the announcement is performed, so that the state of the mobile device concerning the announcement is resets to be the initial state.

Further, according to the detailed characteristic described in this specification, the control unit resets the state of the mobile device concerning the announcement to be the initial state by resetting the signal, so as to prepare for precognition of an arrival of the vehicle at a next expected getting-off place in advance in the case where the owner does not get off the vehicle at the expected getting-off place that is announced, or the case where the owner gets off the vehicle and gets on another vehicle.

In addition, according to another characteristic described in this specification, a mobile device is provided, including a keeping unit which keeps a plurality of types of announcement data to be output from the audio output unit, and a control unit which selects one of the plurality of types of announcement data on the basis of the precognition of the arrival at the expected getting-off place of the vehicle on which the owner of the mobile device boards and controls the audio output unit to output the selected one. Thus, it is possible to perform the announcement corresponding to the precognition so as to avoid confusion. In addition, reliability of the announcement can be improved because uncertain information is not announced.

In addition, according to the detailed characteristic described in this specification, the plurality of types of announcement data include different data corresponding to reliabilities of the precognition by the control unit. For instance, a get-off recommendation is performed in the case of precognition of an arrival at the expected getting-off place set on the basis of the commuter ticket information, while only an attention announcement is performed in the case of precognition of an arrival on the basis of the ticket information that cannot always confirm the expected getting-off place. Thus, an appropriate announcement can be performed in accordance with reliability of the precognition.

In addition, according to another characteristic described in this specification, a mobile device is provided, including an adjustment unit which adjusts audio volume of the audio output unit, a precognition unit which foresees an arrival at the expected getting-off place of the vehicle on which the owner of the mobile device boards so that the audio output unit outputs the announcement sound, and a control unit which selects a predetermined audio volume forcibly regardless of adjustment by the adjustment unit when the announcement sound is output from the audio output unit on the basis of the precognition unit. Thus, even if the audio volume is lowered for listening to music, when the announcement sound of the arrival at the expected getting-off place is output, the announcement is performed forcibly at a maximum audio volume, for example, so as to prevent the ride past or the like effectively.

In addition, according to another characteristic described in this specification, a mobile device is provided, including an audio output unit, a precognition unit which foresees an arrival at the expected getting-off place of the vehicle on which the owner of the mobile device boards so that the audio output unit outputs the announcement sound, and a control unit which disables sound output from the audio output unit for a predetermined time before the audio output unit outputs the announcement sound on the basis of the precognition unit. Thus, a silent state is ensured before the announcement sound is output, so that the effect of attention to the announcement performed afterward is enhanced. In addition, according to the detailed characteristic described in this specification, the control unit controls the audio output unit to output music prior to the predetermined time of disabling the sound output. Note that it is not true if the music has already been output from the output unit. This characteristic ensures the state in which music is always output before the silent state, so that the state changes twice, namely from the music output state to the silent state, and from the silent state to the announcement. Thus the effect of attention to the announcement is further enhanced, and the effect of ensuring the silent state is also enhanced.

In addition, according to another characteristic described in this specification, a mobile device is provided, including a vibration generation unit, a selection unit which selects whether or not to generate the vibration by the vibration generation unit, and a control unit which foresees an arrival at the expected getting-off place of the vehicle on which the owner of the mobile device boards and controls the vibration generation unit to vibrate forcibly regardless of the selection of the selection unit. Thus, the vibration generation unit vibrates securely so that ride past or the like can be prevented. Ride past occurs when attentiveness is reduced due to drunken or sleeping, and the characteristic described in this specification relieves the burden of setting appropriately the selection unit for preventing the above-mentioned situation.

In addition, according to another characteristic described in this specification, a mobile device is provided, including an audio output unit, an audio source unit which provides music information to an audio output unit, an adjustment unit which adjusts an audio volume of the audio output unit, an announcement information generation unit, and a control unit which selects a predetermined audio volume forcibly regardless of adjustment by the adjustment unit when announcing the information by the announcement information generation unit. In this way, the characteristic described in this specification can be performed without limiting to the announcement in advance of the arrival of the vehicle at the expected getting-off place.

In addition, according to another characteristic described in this specification, a mobile device is provided, including an audio output unit, an audio source unit which provides music information to the audio output unit, an announcement information generation unit, and a control unit which disables sound output from the audio output unit for a predetermined time before the information by the announcement information generation unit is announced. This characteristic described in this specification can also be performed without limiting to the announcement in advance of an arrival of the vehicle at the expected getting-off place. Note that a preferred example of the audio output unit described above is an earphone.

In addition, according to another characteristic described in this specification, a mobile device is provided, including a vibration generation unit, a selection generation unit which selects whether or not to generate the vibration by the vibration generation unit, an announcement information generation unit, and a control unit which controls the vibration generation unit to generate the vibration forcibly regardless of the selection by the selection generation unit when the information by the announcement information generation unit is announced. This characteristic described in this specification can also be performed without limiting to the announcement in advance of the arrival of the vehicle at the expected getting-off place.

Industrial Applicability

The present invention can be embodied appropriately for utilizing effectively information and functions of a mobile device, for example.

Explanation of Numerals 2 mobile phone
4 mobile control unit (adjustment unit, precognition unit, selection unit, announcement information generation unit)
6 mobile operation unit (adjustment unit, selection unit)
8 telephone function unit
10 storage unit (keeping unit, audio source unit)
12 display unit (selection unit)
14 GPS unit
16 telephone communication unit
18 mobile short range communication unit
20 vibration unit (announcement unit, vibration generation unit)
22 main power supply
24 auxiliary power supply
26 acceleration sensor
30, 32 earphone (announcement unit, audio output unit)
34 remote controller
36 remote control operation unit
38 display unit
40 station server
42 server control unit
44 server communication unit
46 server storage unit
48 ticket examiner machine
50 ticket examiner control unit
52 ticket examiner storage unit
54 ticket examiner short range communication unit
56 ticket examiner detecting/processing unit

What is claimed is:

1. A mobile device comprising:
an audio output unit;
an audio source unit which provides music information to the audio output unit;
an adjustment unit which adjusts audio volume of the audio output unit;
an announcement information generation unit which provides announcement information to the same audio output unit to which the music information is provided by the audio source unit with the volume adjustment by the adjustment unit; and
a control unit which selects a predetermined high level of audio volume forcibly regardless of adjustment by the adjustment unit when information by the announcement information generation unit is announced from the audio output unit, wherein the announcement information is output at the audio output unit with the high level even if the music information has been output at the same audio output with an adjusted lower level of audio volume than the predetermined high level of audio volume.

2. A mobile device according to claim 1, wherein the audio output unit includes an earphone.

3. A mobile device according to claim 1, wherein the control unit disables the audio output unit to mute the music information for a predetermined time before initiating the announcement by the announcement information generation unit from the audio output unit, whereby the announcement is made more effective to be remarked.

4. A mobile device comprising:
an audio output unit;
a vibration generation unit, which provides vibration other than words;
a selection unit which selects whether or not to generate vibration by the vibration generation unit;
an announcement information generation unit, which provides announcement information to the audio output unit; and
a control unit which controls the vibration generation unit to generate vibration forcibly regardless of selection by the selection unit when announcement information by the announcement information generation unit is provided to the audio output unit, wherein the announcement information is accompanied by the vibration even if the selection unit has selected not to generate vibration by the vibration generation unit, such that the announcement is made more likely to be noticed.

5. A mobile device according to claim 4, comprising an acceleration detection unit, a storage unit which stores an acceleration variation pattern that is unique to a predetermined movement of the entire mobile device, a comparison unit which compares acceleration variation detected by the acceleration detection unit with the acceleration variation pattern stored in the storage unit, and a decision unit which decides whether or not there was a predetermined movement of the entire mobile device on the basis of a result of the comparison by the comparison unit, wherein the announcement information generation unit generates the announcement information on the basis of the decision by the decision unit.

6. A mobile device comprising:
an acceleration detection unit;
a storage unit which stores an acceleration variation pattern that is unique to a predetermined movement of the entire mobile device;
a comparison unit which compares acceleration variation detected by the acceleration detection unit with the acceleration variation pattern stored in the storage unit;
a decision unit which decides whether or not there was a predetermined movement of the entire mobile device on the basis of a result of the comparison by the comparison unit;
an announcement information generation unit which generates announcement information on the basis of the decision by the decision unit; and
a transmission unit which transmits a result of decision by the decision unit externally.

7. A mobile device according to claim 6, further comprising a position detection unit which detects a position of the mobile device itself, wherein the decision unit decides whether or not there was a predetermined movement of the entire mobile device on the basis of the acceleration detection unit and the position detection unit.

8. A mobile device according to claim 6, further comprising an information obtaining unit which obtains information about location of the mobile device itself, and a decision unit which decides a location of the entire mobile device on the basis of the acceleration detection unit and the information obtaining unit.

9. A mobile device according to claim 6, wherein the storage unit stores an acceleration variation pattern that is unique to departure of the vehicle on which the owner of the mobile device boards, and the decision unit decides the departure of the vehicle.

10. A mobile device according to claim 6, wherein the storage unit stores an acceleration variation pattern that is unique to stopping of the vehicle on which the owner of the mobile device boards, and the decision unit decides the stopping of the vehicle in advance.

11. A mobile device according to claim 6, further comprising a control unit which estimates in advance an arrival at an expected getting-off place of the vehicle on which the owner of the mobile device boards on the basis of the decision unit.

12. A mobile device according to claim 11, wherein the control unit includes a counter which counts the number of times of a predetermined movement detected by the decision unit, and estimates in advance an arrival of the vehicle at the expected getting-off place on the basis of a count value of the counter.

13. A mobile device comprising:
an acceleration detection unit;
a storage unit which stores an acceleration variation pattern that is unique to a predetermined movement of the entire mobile device;
a comparison unit which compares acceleration variation detected by the acceleration detection unit with the acceleration variation pattern stored in the storage unit;
a decision unit which decides whether or not there was a predetermined movement of the entire mobile device on the basis of a result of the comparison by the comparison unit;
a current time information obtaining unit; and
a control unit which estimates a next movement of the entire mobile device on the basis of a predetermined movement detected by the decision unit and current time obtained by the current time information obtaining unit.

14. A mobile device according to claim 13, further comprising a keeping unit of position information of an expected getting-off place of the vehicle, a position detection unit which detects a position of the mobile device itself, and an approach detection unit which detects an approach of the vehicle at the expected getting-off place on the basis of position information of the keeping unit and a position detected by the position detection unit, wherein an arrival of the vehicle at an expected getting-off place is estimated in advance on the basis of the approach detection by the approach detection unit and a predetermined movement decided by the decision unit.

15. A mobile device comprising:
an acceleration detection unit;
a storage unit which stores an acceleration variation pattern that is unique to a predetermined movement of the entire mobile device;
a comparison unit which compares acceleration variation detected by the acceleration detection unit with the acceleration variation pattern stored in the storage unit;
a decision unit which decides whether or not there was a predetermined movement of the entire mobile device on the basis of a result of the comparison by the comparison unit;
a position detection unit which detects a position of the mobile device itself; and
a control unit which estimates a next movement of the entire mobile device on the basis of a predetermined movement decided by the decision unit and a position detected by the position detection unit.

16. A mobile device comprising:
an acceleration detection unit;
a storage unit which stores an acceleration variation pattern that is unique to a predetermined movement of the entire mobile device;
a comparison unit which compares acceleration variation detected by the acceleration detection unit with the acceleration variation pattern stored in the storage unit;
a decision unit which decides whether or not there was a predetermined movement of the entire mobile device on the basis of a result of the comparison by the comparison unit;
a keeping unit which keeps information about a plan of movement of the entire mobile device; and
a control unit which estimates a next movement of the entire mobile device on the basis of a predetermined movement decided by the decision unit and information kept by the keeping unit.

17. A mobile device comprising:
an acceleration detection unit;
a storage unit which stores an acceleration variation pattern that is unique to a predetermined movement of the entire mobile device;
a comparison unit which compares acceleration variation detected by the acceleration detection unit with the acceleration variation pattern stored in the storage unit;
a decision unit which decides whether or not there was a predetermined movement of the entire mobile device on the basis of a result of the comparison by the comparison unit;
wherein the decision unit estimates that the vehicle on which the owner of the mobile device boards is decelerating so as to stop at a predetermined station.

18. A mobile device comprising:
an acceleration detection unit;
a storage unit which stores an acceleration variation pattern that is unique to a predetermined movement of the entire mobile device;
a comparison unit which compares acceleration variation detected by the acceleration detection unit with the acceleration variation pattern stored in the storage unit;
a decision unit which decides whether or not there was a predetermined movement of the entire mobile device on the basis of a result of the comparison by the comparison unit;
a ticket information providing unit;
an event information providing unit; and
a control unit which estimates a place to get off the vehicle on the basis of information from the ticket information providing unit and the event information providing unit, wherein the announcement unit generates announcement information about a relationship between the mobile device and the place to get off on the basis of the estimation by the control unit and the decision by the decision unit.

19. A mobile device according to claim 18, wherein the information provided by the event information providing unit relates to an actually boarding vehicle, and the control unit removes a place to get on or off where the vehicle does not stop from estimation candidates on the basis of the information from the event information providing unit.

* * * * *